United States Patent
Kolker et al.

(10) Patent No.: US 9,768,605 B2
(45) Date of Patent: Sep. 19, 2017

(54) ARC FAULT DETECTION SYSTEM AND METHOD AND CIRCUIT INTERRUPTER EMPLOYING SAME

(71) Applicant: EATON CORPORATION, Cleveland, OH (US)

(72) Inventors: David Kolker, Sarasota, FL (US); Chaitanya Bhalwankar, Maharashtra (IN); Birger Pahl, Milwaukee, WI (US); Steven Christopher Schmalz, Franklin, WI (US); Archit Agarwal, Rajasthan (IN)

(73) Assignee: EATON CORPORATION, Cleveland, OH (US)

( * ) Notice: Subject to any disclaimer, the term of this patent is extended or adjusted under 35 U.S.C. 154(b) by 121 days.

(21) Appl. No.: 14/584,122

(22) Filed: Dec. 29, 2014

(65) Prior Publication Data

US 2016/0187407 A1    Jun. 30, 2016

(51) Int. Cl.
*H02H 1/00* (2006.01)
*G01R 19/165* (2006.01)
*G01R 31/02* (2006.01)
*G01R 31/00* (2006.01)

(52) U.S. Cl.
CPC ......... *H02H 1/0015* (2013.01); *G01R 31/025* (2013.01); *G01R 19/165* (2013.01); *G01R 31/008* (2013.01); *G01R 31/024* (2013.01)

(58) Field of Classification Search
CPC ...... G01R 31/024; G01R 31/12; G01R 35/00; G01R 19/165
USPC ........................................................ 324/551
See application file for complete search history.

(56) References Cited

U.S. PATENT DOCUMENTS

| | | | | |
|---|---|---|---|---|
| 5,828,219 A | * | 10/1998 | Hanlon | .............. G01V 3/06 324/326 |
| 6,504,692 B1 | * | 1/2003 | Macbeth | .............. H02H 1/0015 361/42 |
| 7,190,561 B2 | * | 3/2007 | Pellon | .............. H02H 1/0015 361/5 |

(Continued)

OTHER PUBLICATIONS

S. McConnell, Z. Wang, R. S. Balog and J. Johnson, "Evaluation method for arc fault detection algorithms," 2014 IEEE 40th Photovoltaic Specialist Conference (PVSC), Denver, CO, 2014, pp. 3201-3206. doi: 10.1109/PVSC.2014.6925616.*

*Primary Examiner* — Jermele M Hollington
*Assistant Examiner* — Christopher McAndrew
(74) *Attorney, Agent, or Firm* — Eckert Seamans; Philip Levy; Grant Coffield

(57) ABSTRACT

A DC arc fault detection module includes a current detecting section having at least one output, wherein the current detecting section is structured to determine whether at least one signal based on a current measured from a DC supply line exceeds at least one corresponding predetermined threshold level and cause the at least one output to indicate that the threshold level has been exceeded. The module also includes a processing device structured to: (i) receive the at least one output, (ii) determine whether an arc fault in the DC electrical system has occurred based on at least the at least one output, (iii) determine an estimation of background noise based on at least one signal indicative of a current on the DC supply line, and (iv) adjust the at least one corresponding predetermined threshold level based on the estimation of background noise.

14 Claims, 21 Drawing Sheets

(56) References Cited

U.S. PATENT DOCUMENTS

| | | | | |
|---|---|---|---|---|
| 7,242,291 B2* | 7/2007 | Nicolls | G01R 31/3277 | 324/500 |
| 7,253,637 B2* | 8/2007 | Dvorak | G01R 31/024 | 324/536 |
| 7,366,622 B1* | 4/2008 | Nemir | G01R 31/1272 | 361/2 |
| 7,570,465 B2* | 8/2009 | Beatty, Jr. | H02H 9/00 | 361/42 |
| 7,633,727 B2* | 12/2009 | Zhou | H02H 1/0015 | 361/42 |
| 8,218,274 B2 | 7/2012 | Hastings et al. | | |
| 8,605,091 B2* | 12/2013 | Bradbury | G09G 5/00 | 345/30 |
| 8,891,211 B2* | 11/2014 | Dent | G01R 31/024 | 361/42 |
| 2003/0099070 A1* | 5/2003 | Macbeth | H02H 1/0015 | 361/5 |
| 2004/0156154 A1* | 8/2004 | Lazarovich | H02H 1/0015 | 361/42 |
| 2004/0263183 A1* | 12/2004 | Naidu | G01R 31/025 | 324/536 |
| 2006/0203401 A1* | 9/2006 | Kojori | H02H 1/0015 | 361/42 |
| 2006/0214670 A1* | 9/2006 | Naidu | G01R 31/025 | 324/536 |
| 2007/0057678 A1* | 3/2007 | Dvorak | G01R 31/024 | 324/536 |
| 2010/0073013 A1* | 3/2010 | Zeller | G01R 31/3277 | 324/551 |
| 2011/0007443 A1* | 1/2011 | Crookham | H02H 3/347 | 361/93.2 |
| 2011/0019444 A1* | 1/2011 | Dargatz | H02H 1/0015 | 363/50 |
| 2011/0090607 A1* | 4/2011 | Luebke | H01L 31/02021 | 361/42 |
| 2011/0141644 A1* | 6/2011 | Hastings | H01L 31/02021 | 361/93.2 |
| 2011/0181296 A1* | 7/2011 | Kolker | G01R 31/025 | 324/551 |
| 2012/0206843 A1* | 8/2012 | Dargatz | H02H 1/0015 | 361/18 |
| 2013/0335861 A1* | 12/2013 | Laschinski | H02H 1/0015 | 361/2 |

* cited by examiner

ARC FAULT DETECTION SYSTEM AND METHOD AND CIRCUIT INTERRUPTER EMPLOYING SAME

BACKGROUND

Field

The disclosed concept pertains generally to arc fault detection in electrical circuits, and, more particularly, to a system and method for detecting arc faults, such as high voltage DC parallel arc faults, and circuit interrupters employing same.

Background Information

Existing aircraft arc fault protection devices are intended only for 115 VAC, 400 Hz (constant frequency) and 28 VDC electrical systems. However, the current trend in the aviation industry is to replace conventional hydraulic, pneumatic, and mechanical systems and sub-systems with electric equivalents. It is believed that such a transition in aircraft will lower the total cost of ownership and/or operation, enhance propulsion efficiency and reduce environmental impact. Another trend in the aviation industry is toward higher passenger comfort and in-flight entertainment and communications systems. These trends are known in the aviation industry as the "More Electric Aircraft", and will result in an ever increasing demand on an aircraft's power requirements. As a result, future aircraft grids intend to use high voltage AC and DC buses to distribute electric power in the aircraft to feed the increased number of electric loads such as, without limitation, electromechanical and electro hydraulic actuators and in-flight electronic entertainment systems. Currently, 230 VAC, variable frequency from 360 Hz to 800 Hz AC systems and ±270 VDC and 540 VDC DC systems are being considered for standardization.

The chances of arc fault occurrence in such high voltage future aircraft systems are higher than with the lower voltage current grids of conventional aircraft systems. There is thus a need for improved arc fault detection systems and methods capable of detecting arc faults in high voltage AC and DC systems such as those that will be used implement the More Electric Aircraft of the future.

SUMMARY

In one embodiment, a DC arc fault detection module for detecting arc faults in a DC electrical system having a DC supply line is provided. The module includes a current detecting section having at least one output, wherein the current detecting section is structured to determine whether at least one signal based on a current measured from the DC supply line exceeds at least one corresponding predetermined threshold level and cause the at least one output to indicate that the at least one corresponding predetermined threshold level has been exceeded in response to detecting that the at least one signal based on the current measured from the DC supply line exceeds the at least one corresponding predetermined threshold level. The module also includes a processing device structured to: (i) receive the at least one output, (ii) determine whether an arc fault in the DC electrical system has occurred based on at least the at least one output, (iii) determine an estimation of background noise based on at least one signal indicative of a current on the DC supply line, and (iv) adjust the at least one corresponding predetermined threshold level based on the estimation of background noise.

In another embodiment, a method of detecting arc faults in a DC electrical system having a DC supply line is provided. The method includes determining whether at least one signal based on a current measured from the DC supply line exceeds at least one corresponding predetermined threshold level, controlling at least one output signal based on whether the at least one signal based on the current measured from the DC supply line exceeds the at least one corresponding predetermined threshold level, determining whether an arc fault in the DC electrical system has occurred based on at least the at least one output signal, determining an estimation of background noise based on at least one signal indicative of a current on the DC supply line, and adjusting the at least one corresponding predetermined threshold level based on the estimation of background noise.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
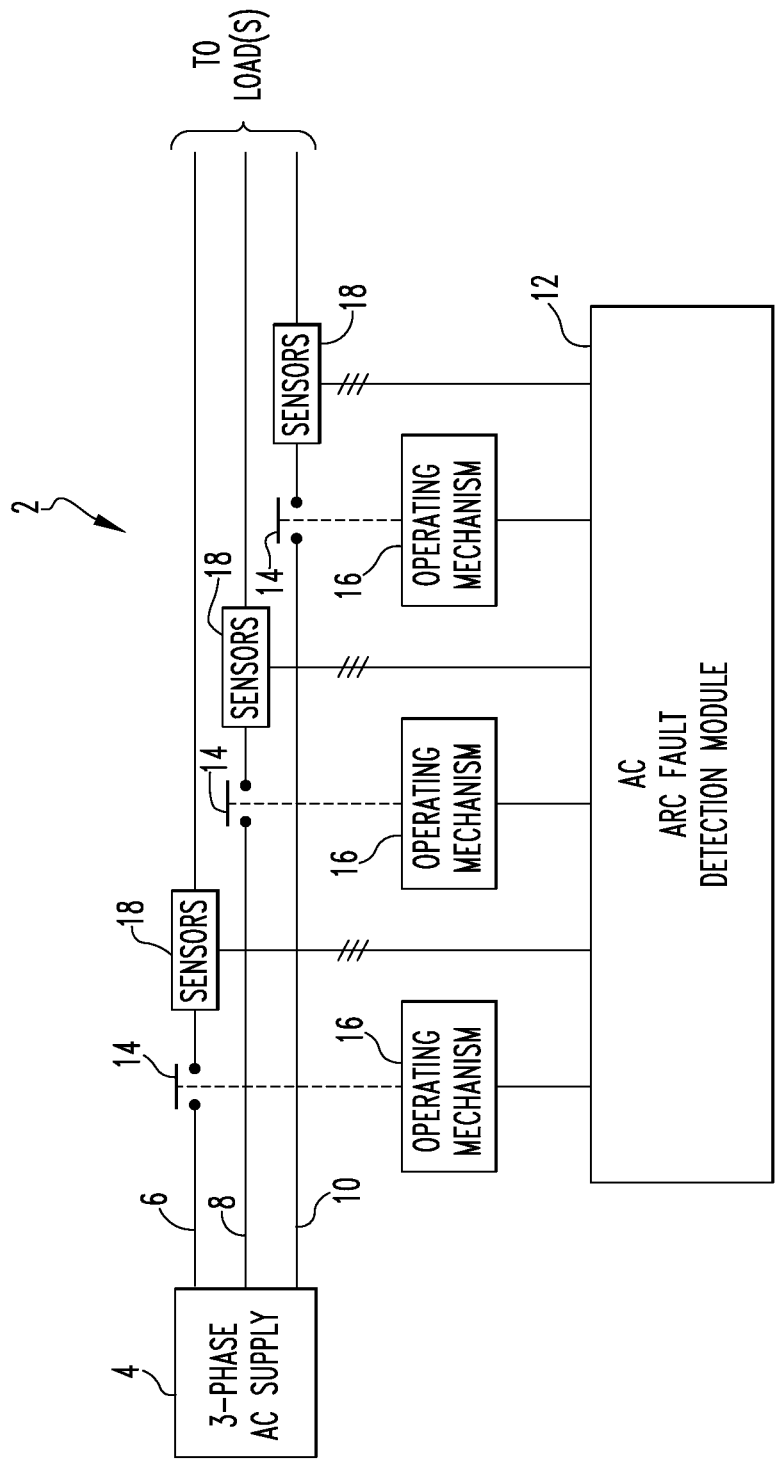
FIG. 1 is a schematic block diagram of a high voltage AC electrical system according to an exemplary embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the term "number" shall mean one or an integer greater than one (i.e., a plurality).

As employed herein, the statement that two or more parts are "coupled" together shall mean that the parts are joined together either directly or joined through one or more intermediate parts.

FIG. 1 is a schematic block diagram of a high voltage AC electrical system 2 according to an exemplary embodiment of the disclosed concept, which may be, for example and without limitation, a "More Electric" high voltage AC aircraft electrical system. As seen in FIG. 1, high voltage AC electrical system 2 includes a high voltage, 3-phase AC supply 4, which may be, for example and without limitation, a 230 VAC, 360 Hz to 800 Hz 3-phase AC supply. 3-phase AC supply 4 feeds phase lines 6, 8 and 10 of high voltage AC electrical system 2, which, in the illustrated embodiment, are the R, Y, and B phases, respectively, of high voltage AC electrical system 2.

As seen in FIG. 1, high voltage AC electrical system 2 includes an AC arc fault detection module 12. AC arc fault detection module 12 is described in greater detail herein and is structured to provide protection against AC parallel arc faults in high voltage AC electrical system 2. In particular, each phase line 6, 8, 10 is provided with a respective set of separable contacts 14 which are driven by an associated operating mechanism 16. Each phase line 6, 8, 10 is also provided with a number of sensors 18 structured to measure various parameters of the associated phase line 6, 8, 10 and provide information regarding the parameters measured thereby to AC arc fault detection module 12. Thus, as described in greater detail herein and according to an aspect of the disclosed concept, AC arc fault detection module 12 is structured to monitor each of the phase lines 6, 8, 10, and in response to detecting conditions indicative of a parallel arc fault therein based on the measured parameters, cause the associated operating mechanism 16 to open the associated separable contacts 14 to extinguish the arc fault and protect high voltage AC electrical system to from the arc fault. In one embodiment, separable contacts 14, operating mechanisms 16, sensors 18, and AC arc fault detection module 12 may be provided within a circuit interrupter, such as a circuit breaker. In another embodiment, separable contacts 14, operating mechanism 16 and sensors 18 may be provided within a circuit interrupter, such as a circuit breaker or a solid state switch, and AC arc fault detection module 12 may be provided as an add-on module in the form of a separate unit.

Figure 2:
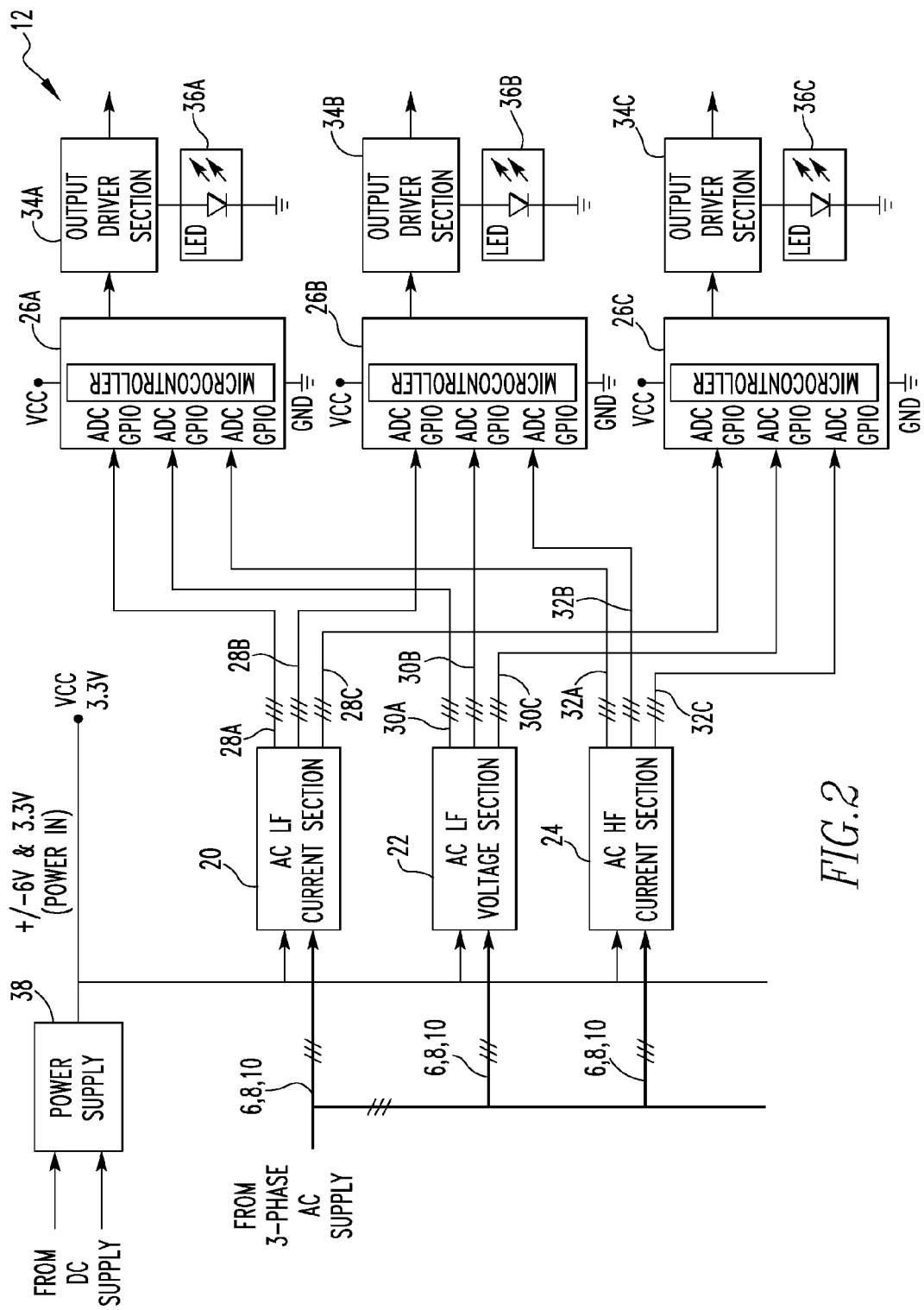
FIG. 2 is a top level, schematic block diagram of an AC arc fault detection module according to a non-limiting, exemplary embodiment of the disclosed concept.

FIG. 2 is a top level, schematic block diagram of AC arc fault detection module 12 according to a non-limiting, exemplary embodiment of the disclosed concept. AC arc fault detection module 12 includes an AC low frequency (LF) current section 20, an AC low frequency (LF) voltage section 22 and an AC high frequency (HF) current section 24, each of which is described in greater detail herein. Furthermore, AC arc fault detection module 12 includes 3 separate microcontrollers, labeled 26A, 26B and 26C, with each microcontroller 26A, 26B, 26C being associated with a particular phase of 3-phase AC supply 4. In the illustrated, exemplary embodiment, microcontroller 26A is associated with phase line 6 and therefore phase R of high voltage AC electrical system 2, microcontroller 26B is associated with phase line 8 and therefore phase Y of high voltage AC electrical system 2, and microcontroller 26C is associated with phase line 10 and therefore phase B of high voltage AC electrical system 2. While microcontrollers 26A, 26B and 26C are shown in FIG. 2, it will be understood that that is not meant to be limiting and that alternative types of processing devices, such as, without limitation, microprocessors or programmable logic controllers, may also be used.

As seen in FIG. 2, AC LF current section 20 has a number of outputs 28A (described in greater detail herein) which are associated with phase R and are provided as inputs to microcontroller 26A, a number of outputs 28B (described in greater detail herein) which are associated with phase Y and are provided as inputs to microcontroller 26B, and a number of outputs 28C (described in greater detail herein) which are associated with phase Y and are provided as inputs to microcontroller 26C. Similarly, AC LF voltage section 22 has a number of outputs 30A (described in greater detail herein) which are associated with phase R and are provided as inputs to microcontroller 26A, a number of outputs 30B (described in greater detail herein) which are associated with phase Y and are provided as inputs to microcontroller 26B, and a number of outputs 30C (described in greater detail herein) which are associated with phase Y and are provided as inputs to microcontroller 26C, and AC HF current section 24 has a number of outputs 32A (described in greater detail herein) which are associated with phase R and are provided as inputs to microcontroller 26A, a number of outputs 32B (described in greater detail herein) which are associated with phase Y and are provided as inputs to microcontroller 26B, and a number of outputs 32C (described in greater detail herein) which are associated with phase Y and are provided as inputs to microcontroller 26C.

As described in greater detail herein, each microcontroller 26A, 26B, 26C is structured and configured to detect the presence of an AC parallel arc fault on the associated phase line 6, 8, 10 using the inputs just described. More specifically, as is known in the art, when an AC arc fault occurs, the following also occurs within the associated electrical system: (i) a sudden rise in AC current, (ii) a dip in AC voltage that is synchronous with the sudden rise in AC current, and (ii) generation of a significant amount of high-frequency noise. As described in greater detail herein, AC LF current section 20 functions to monitor the AC currents of 3-phase AC supply 4 and look for such sudden rises in AC current, AC LF voltage section 22 functions to monitor the AC voltages of 3-phase AC supply 4 and look for such dips in AC voltage, and AC HF current section 24 functions to monitor the AC currents of 3-phase AC supply 4 and look for evidence of such high-frequency noise in certain selected frequency bands. As described in greater detail herein, all of this information is then used as part of an overall arc fault detection methodology of AC arc fault detection module 12 to detect actual arc faults (i.e., non-nuisance faults) and take appropriate action to protect high voltage AC electrical system 2.

AC arc fault detection module 12 further includes a first output driver section 34A and a number of LEDs 36A coupled to microcontroller 26A, a second output driver section 34B and a number of LEDs 36B coupled to microcontroller 26B, a third output driver section 34C and a number of LEDs 36C coupled to microcontroller 26C. The function of each of these components is described in greater detail herein.

Finally, in the exemplary embodiment, AC arc fault detection module 12 includes a power supply 38 that receives DC power from a DC supply, such as, without limitation, a 28V DC isolated supply, and outputs a number of power signals (e.g., VCC of 3.3V DC) for powering the various electronic components of AC arc fault detection module 12. Alternatively, power for the electronic components of AC arc fault detection module 12 can be provided using 3-phase AC supply 4 rather than a separate, additional 28V DC isolated supply.

Figure 3A:
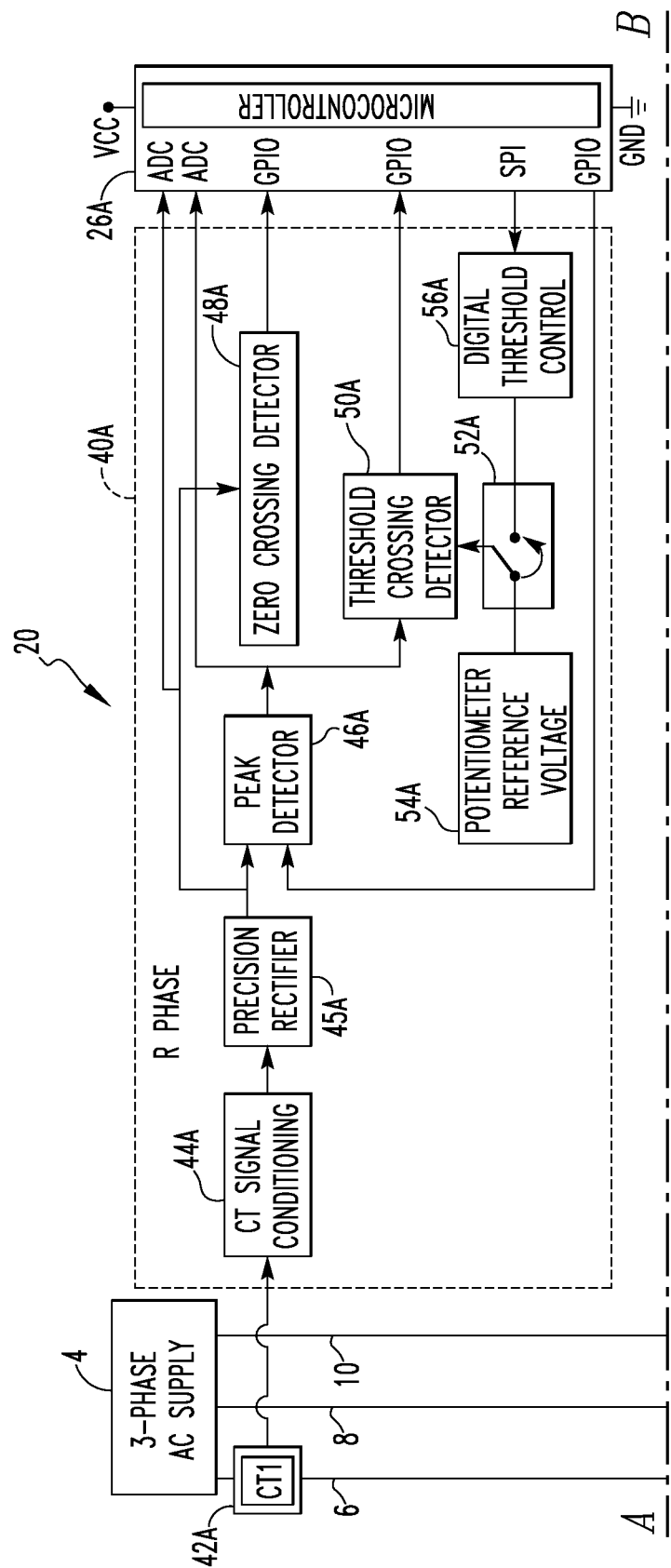
FIGS. 3A-3C are a schematic, block diagram of a portion of the high voltage AC electrical system of FIG. 1 and the AC arc fault detection module of FIG. 2 which shows the particular components of the AC LF current section in more detail.
Figure 3B:
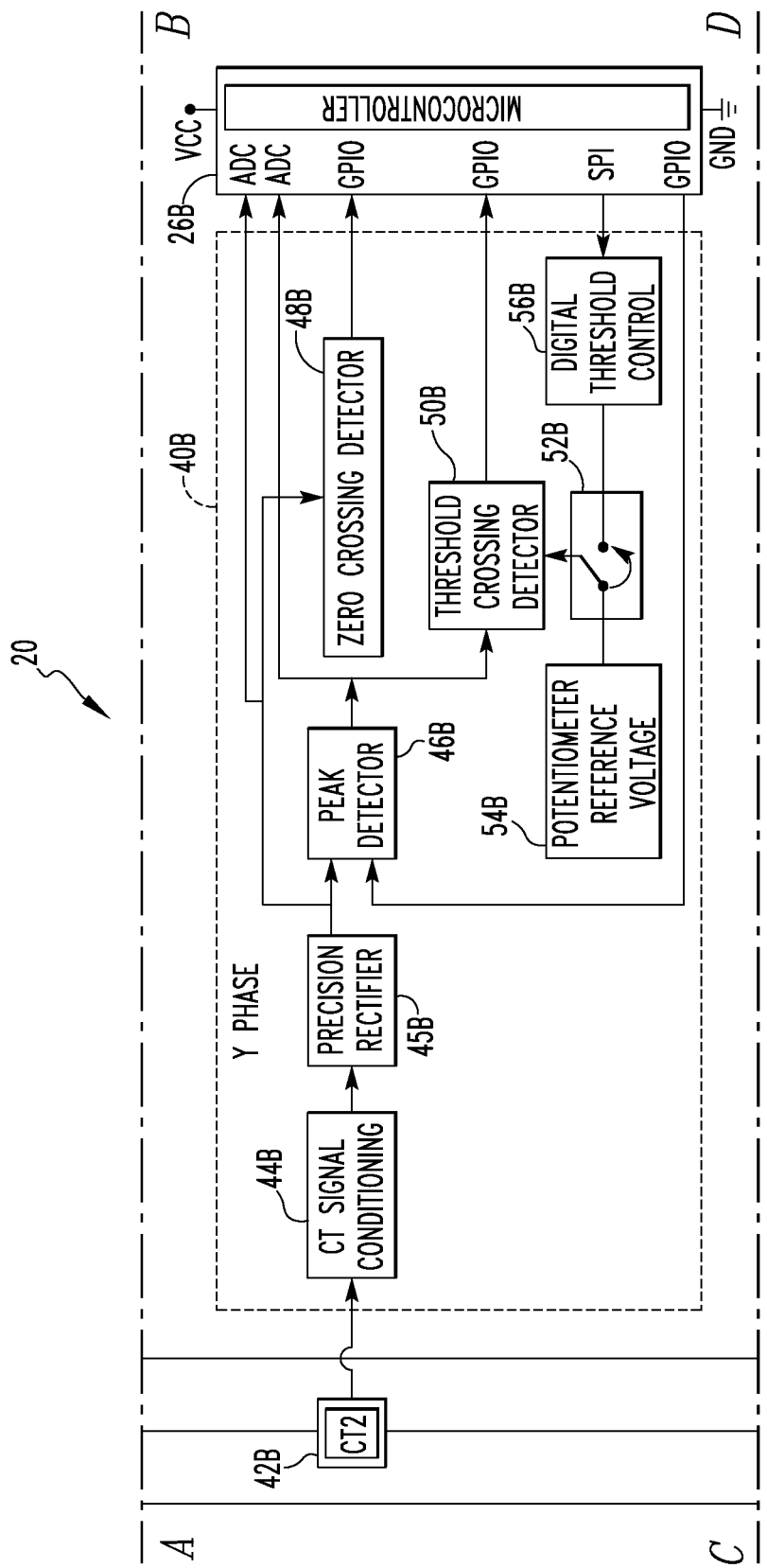
Figure 3C:
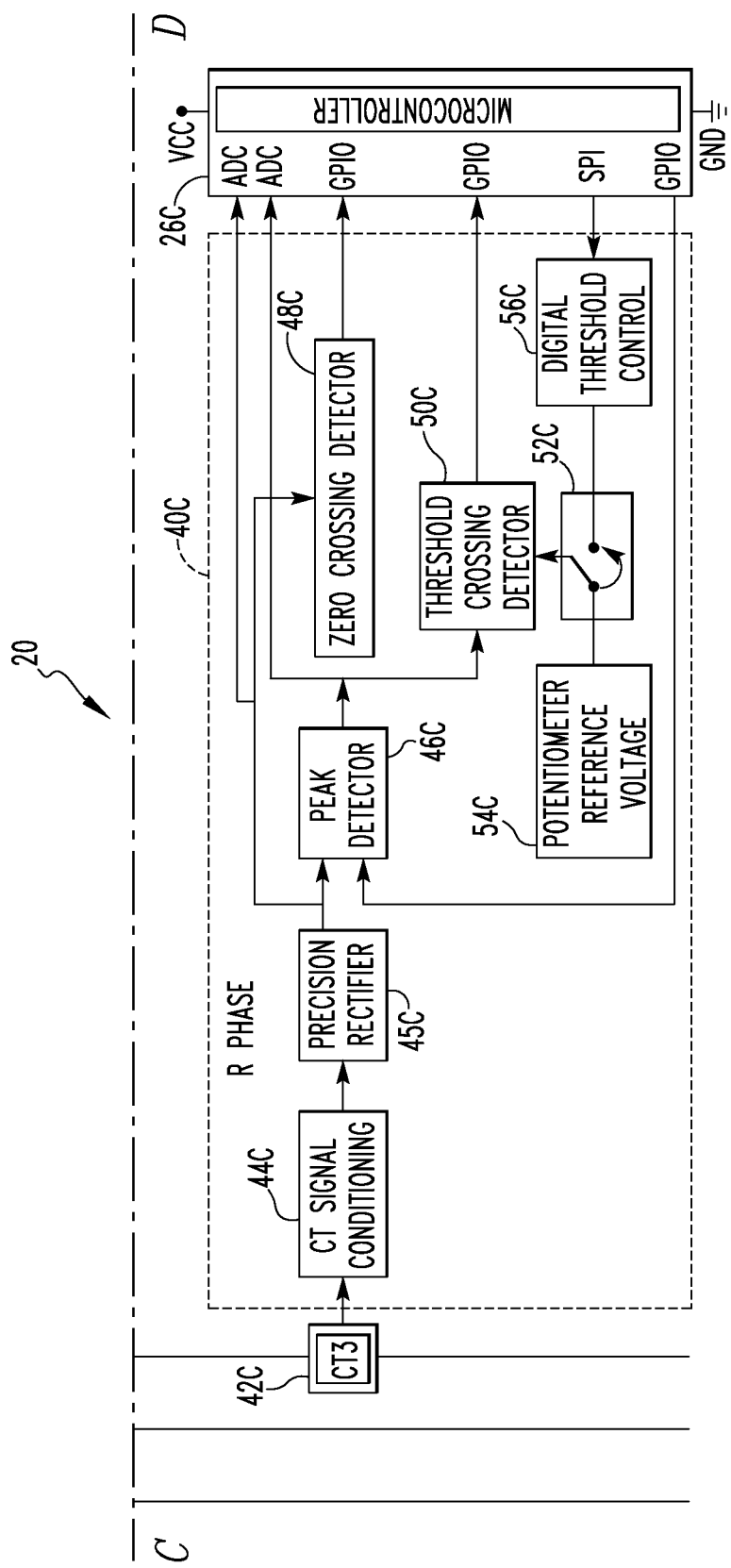

FIGS. 3A-3C are a schematic, block diagram of a portion of high voltage AC electrical system 2 and AC arc fault detection module 12 which shows the particular components of AC LF current section 20 in more detail. As seen in FIGS. 3A-3C, AC LF current section 20 includes three identically structured circuit modules 40, each associated with a particular phase R, Y, B of high voltage AC electrical system 2. More specifically, circuit modules 40 are labelled 40A, 40B and 40C, with circuit module 40A being associated with phase R and microcontroller 26A, circuit module 40B being associated with phase Y and microcontroller 26B, and circuit module 40C being associated with phase B and microcontroller 26C. In addition, each circuit module 40A, 40B, 40C receives as an input the output of an associated current transformer 42A, 42B, 42C forming part of the sensors 18 shown in FIG. 1. In the exemplary embodiment, each current transformer 42A, 42B, 42C measures the "low frequency" current of the associated phase of 3-phase AC supply 4. As used herein, the term "low frequency" shall refer to the AC currents of 3-phase AC supply 4. In one particular embodiment, each current transformer 42A, 42B, 42C is a Hall effect type current sensor, although it will be appreciated that other methods and mechanisms for measuring the current are also possible, such as, without limitation, a current shunt.

As noted above, each circuit module 40A, 40B and 40C has an identical internal structure, and thus for ease of description, only circuit module 40A will be described in detail herein. It will be appreciated, however, that the structure of circuit modules 40B and 40C is identical, and like components are labeled with like reference numerals.

As seen in FIGS. 3A-3C, circuit module 40A includes a CT signal conditioning module 44A, which receives the analog output signal of current transformer 42A and conditions (e.g. filters and amplifies) that signal for further processing. Circuit module 40A further includes a precision rectifier module 45A that is coupled to and receives the conditioned signal output from CT signal conditioning circuitry 44A, and peak detector module 46A that is coupled to and receives the output of precision rectifier module 45A. Precision rectifier module 45A is a highly accurate rectifier that makes a full wave rectification of the AC signal provided to it from CT signal conditioning module 44A. Peak detector module 46A holds the peak of the rectified waveform of precision rectifier module 45A so that, as described herein, microcontroller 26A can sample that signal at any time of the sinusoidal quarter cycle after the peak is reached. The output waveform of precision rectifier module 45A is also provided to a first ADC pin of microcontroller 26A, and the output of the peak detector circuit portion is provided to a second ADC pin of microcontroller 26A for use by microcontroller 26A as described herein (in particular, in a learning mode, microcontroller 26A periodically reads the peaks and uses that information to set the thresholds for threshold crossing detector 50A). Circuit module 40A also includes a zero crossing detector module 48A and a threshold crossing detector module 50A. Zero crossing detector module 48A receives the output waveform of precision rectifier module 45A, and threshold crossing detector module 50A receives the output of the peak detector module 46A. Zero crossing detector module 48A is a low threshold, threshold crossing detector (the zero is actually a very low voltage threshold), and produces a square wave and indicates the starting of each half cycle of the voltage of the R phase of 3-phase AC supply 4. The output of zero crossing detector 48A is provided to a GPIO pin of microcontroller 26A and is used to measure the supply frequency periodically and successively change the quarter cycle or timings of peak reading as described herein.

Threshold crossing detector module 50A is an overcurrent indicator, and has a threshold which is indicative of an overcurrent condition. Thus, threshold crossing detector module 50A is able to serve the same function as a thermal circuit breaker, and the output of threshold crossing detector 50A is provided to another GPIO pin of microcontroller 26A. In the exemplary embodiment, the time constant of the capacitor for threshold crossing detector module 50A is relatively large as compared to the capacitor for zero crossing detector module 48A so that it will not be charged by spikes or noise. Once the threshold crossing detector module 50A determines that the threshold has been crossed (and thus the comparator thereof trips), that event is registered by microcontroller 26A and the capacitor of peak detector module 46A is discharged using an output of microcontroller 26A.

In addition, circuit module 40A includes a potentiometer 52A that is coupled to a potentiometer reference voltage 54A and a digital threshold control 56A controlled by an output of microcontroller 26A. This configuration allows the detection threshold of threshold crossing detector module 50A to be selectively adjusted and programmed by microcontroller 26A.

Figure 4A:
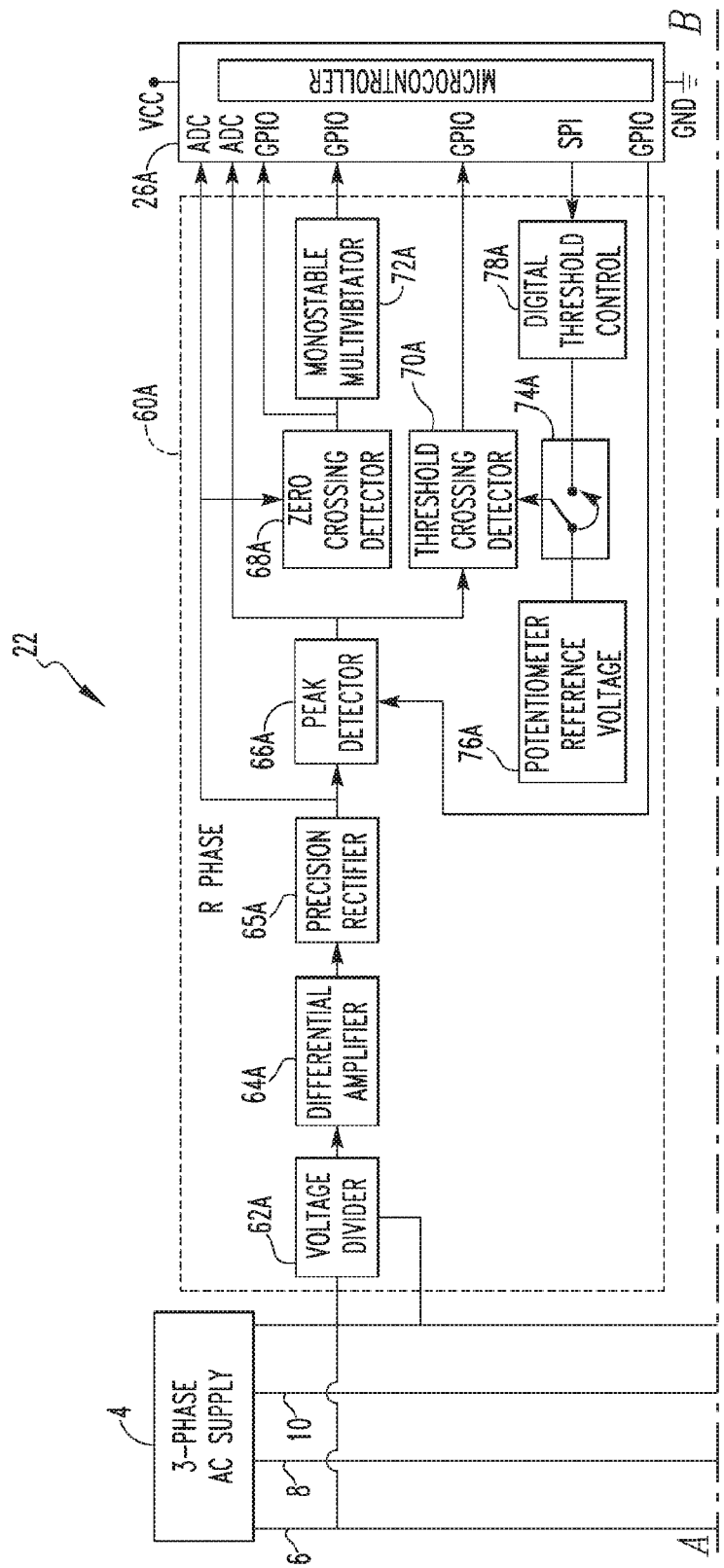
FIGS. 4A-4C are a schematic, block diagram of a portion of the high voltage AC electrical system of FIG. 1 and the AC arc fault detection module of FIG. 2 which shows the particular components of the AC LF voltage section in more detail.
Figure 4B:
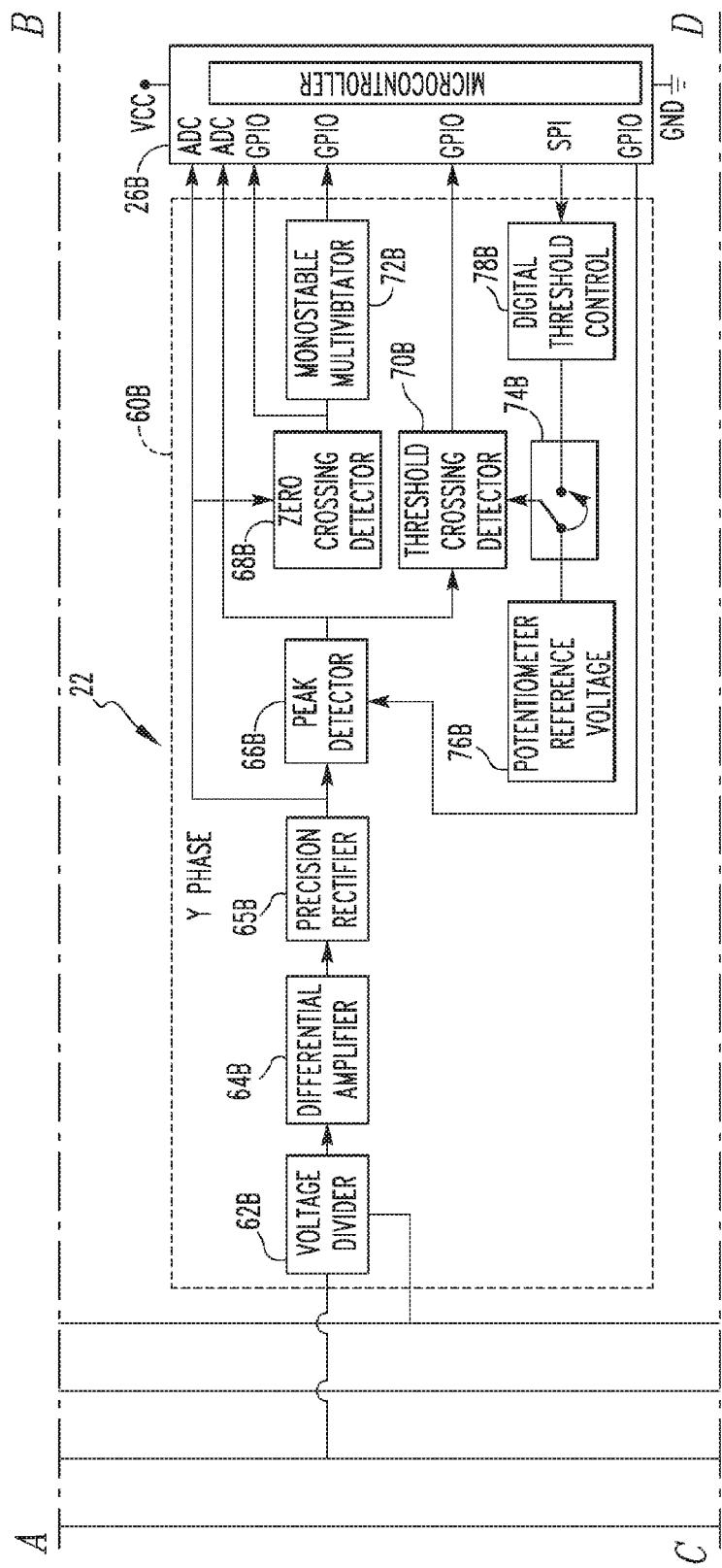
Figure 4C:
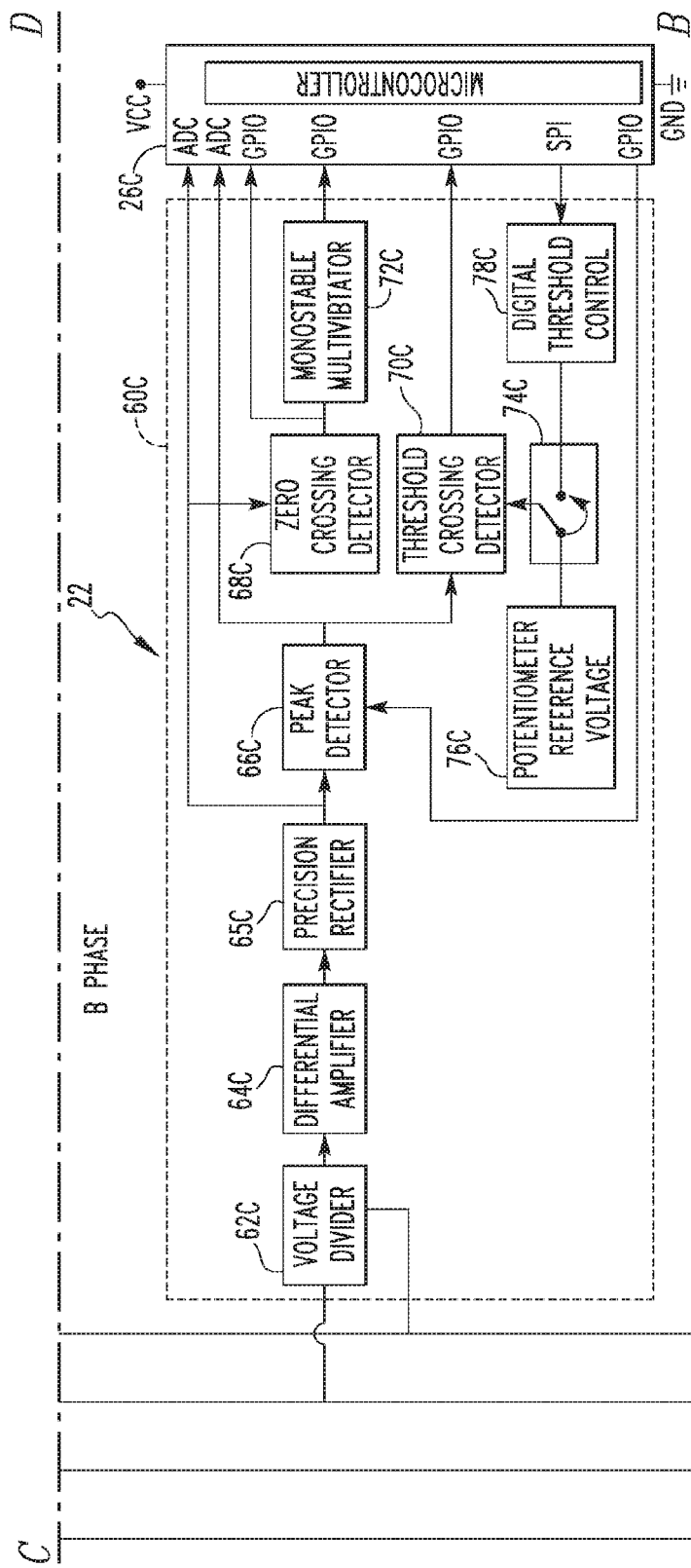

FIGS. 4A-4C are a schematic, block diagram of a portion of high voltage AC electrical system 2 and AC arc fault detection module 12 which shows the particular components of AC LF voltage section 22 in more detail. As seen in FIGS. 4A-4C, AC LF voltage section 22 includes three identically structured circuit modules 60, each associated with a particular phase R, Y, B of high voltage AC electrical system 2. More specifically, circuit modules 60 are labelled 60A, 60B and 60C, with circuit module 60A being associated with phase R and microcontroller 26A, circuit module 60B being associated with phase Y and microcontroller 26B, and circuit module 60C being associated with phase B and microcontroller 26C.

As noted above, each circuit module 60A, 60B and 60C has an identical internal structure, and thus for ease of description, only circuit module 60A will be described in detail herein. It will be appreciated, however, that the structure of circuit modules 60B and 60C is identical, and like components are labeled with like reference numerals.

As seen in FIGS. 4A-4C, circuit module 60A includes a voltage divider 62A which senses the voltage of phase line 6 in a floating configuration. The output of voltage divider 62A is provided to a differential amplifier 64A which is coupled to voltage divider 62A and which converts the floated (differential) signal output by voltage divider 62A to a single ended analog voltage signal on the common electrical ground of microcontroller 26A. Circuit module 60A also includes a precision rectifier 65A coupled to a peak detector 66A. The analog voltage signal output by differential amplifier 62A is provided to precision rectifier 65A. Precision rectifier 65A is a highly accurate rectifier that makes a full wave rectification of the AC signal provided to it. The peak detector 66A holds the peak of the rectified waveform of precision rectifier 65A, and, as a result, microcontroller 26A can sample that signal at any time of the sinusoidal quarter cycle after the peak is reached as needed. The output waveform of precision 65A is provided to an ADC pin of microcontroller 26A, and the output of the peak detector circuit portion is provided to another ADC pin of microcontroller 26A for use by microcontroller 26A to optionally sense analog variations in voltage. Circuit module 60A also includes a zero crossing detector module 68A and a threshold crossing detector module 70A.

Zero crossing detector module 68A receives the output of precision rectifier 65A, and threshold crossing detector module 70A receives the output of the peak detector 66A. Zero crossing detector module 68A is a low threshold, threshold crossing detector (the zero is actually a very low voltage threshold), and produces a square wave and indicates the starting of each half cycle of the voltage of the R phase of 3-phase AC supply 4. The output of zero crossing detector 68A is provided to a GPIO pin of microcontroller 26A and to a monostable multivibrator 72A which is tuned to respond only to the arc fault AC low frequency digital signal from the comparator of the zero crossing detector 68A and not to any nuisance or noise signals. The output of zero crossing detector 68A is used to determine the supply frequency, so that the quarter cycles can be detected to read the peak values as described herein. Monostable multivibrator 72A provides a one-shot output (mono-shot) such that even under the presence of noise, the threshold crossing point of the AC voltage can be precisely timed, with an indication thereof (a pulse signal output by monostable multivibrator 72A) being provided to a GPIO pin of microcontroller 26A as an indicator that a zero crossing has occurred.

Threshold crossing detector 70A compares the analog voltage signal it receives to a predetermined threshold in order to detect dips in AC voltage that are indicative of AC arc faults as described herein. Thus, threshold crossing detector 70A converts the received analog signal into a digital signal. The predetermined threshold is based on a potentiometer 74A that is coupled to a potentiometer reference voltage 76A and a digital threshold control 78A controlled by an output of microcontroller 26A. This configuration allows the detection threshold of threshold crossing detector module 70A to be selectively adjusted and programmed by microcontroller 26A. The output of threshold crossing detector 70A is provided to a GPIO pin of microcontroller 26A.

Figure 5A:
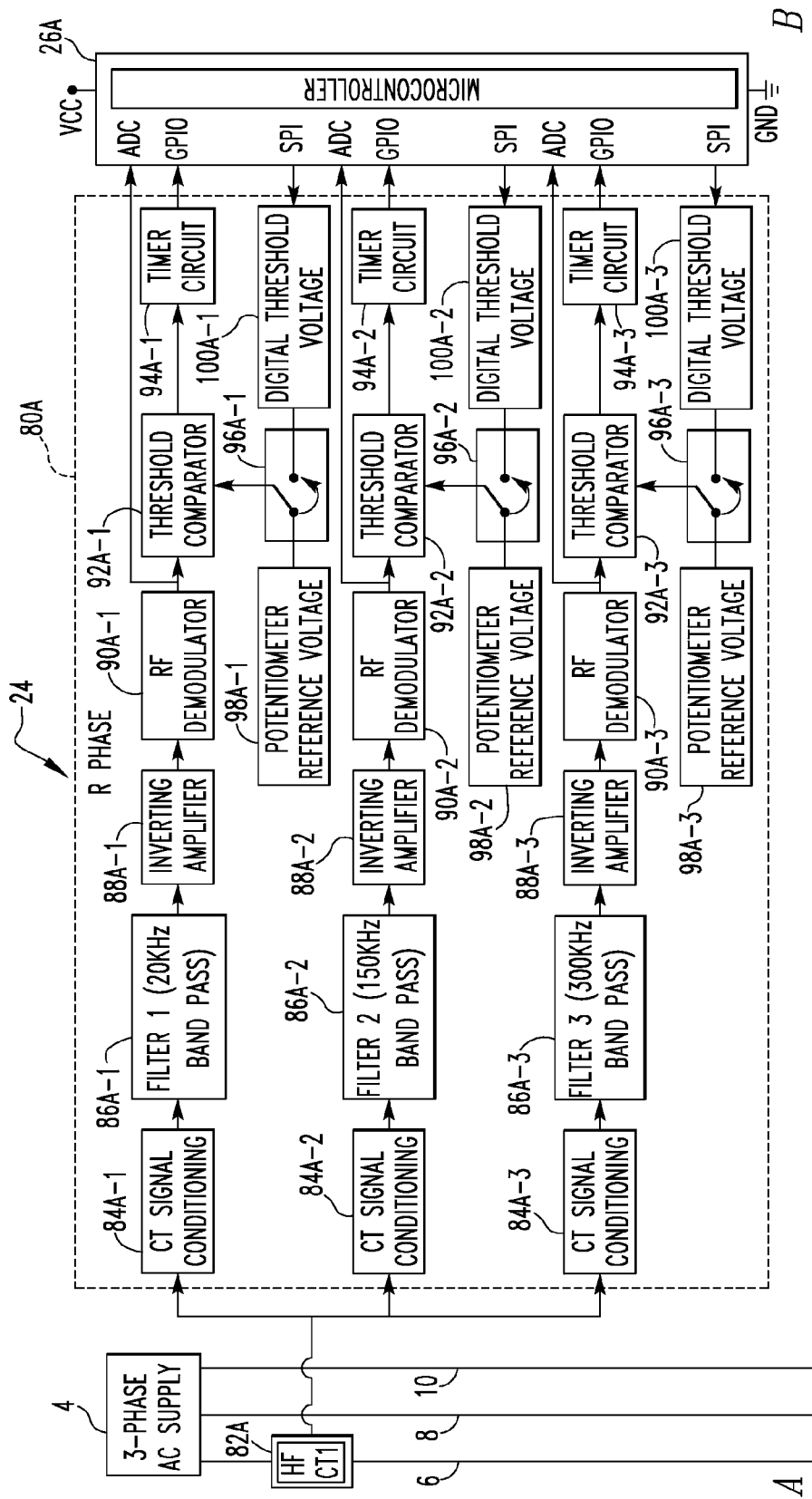
FIGS. 5A-5C are a schematic, block diagram of a portion of the high voltage AC electrical system of FIG. 1 and the AC arc fault detection module of FIG. 2 which shows the particular components of the AC HF current section 24 in more detail.
Figure 5B:
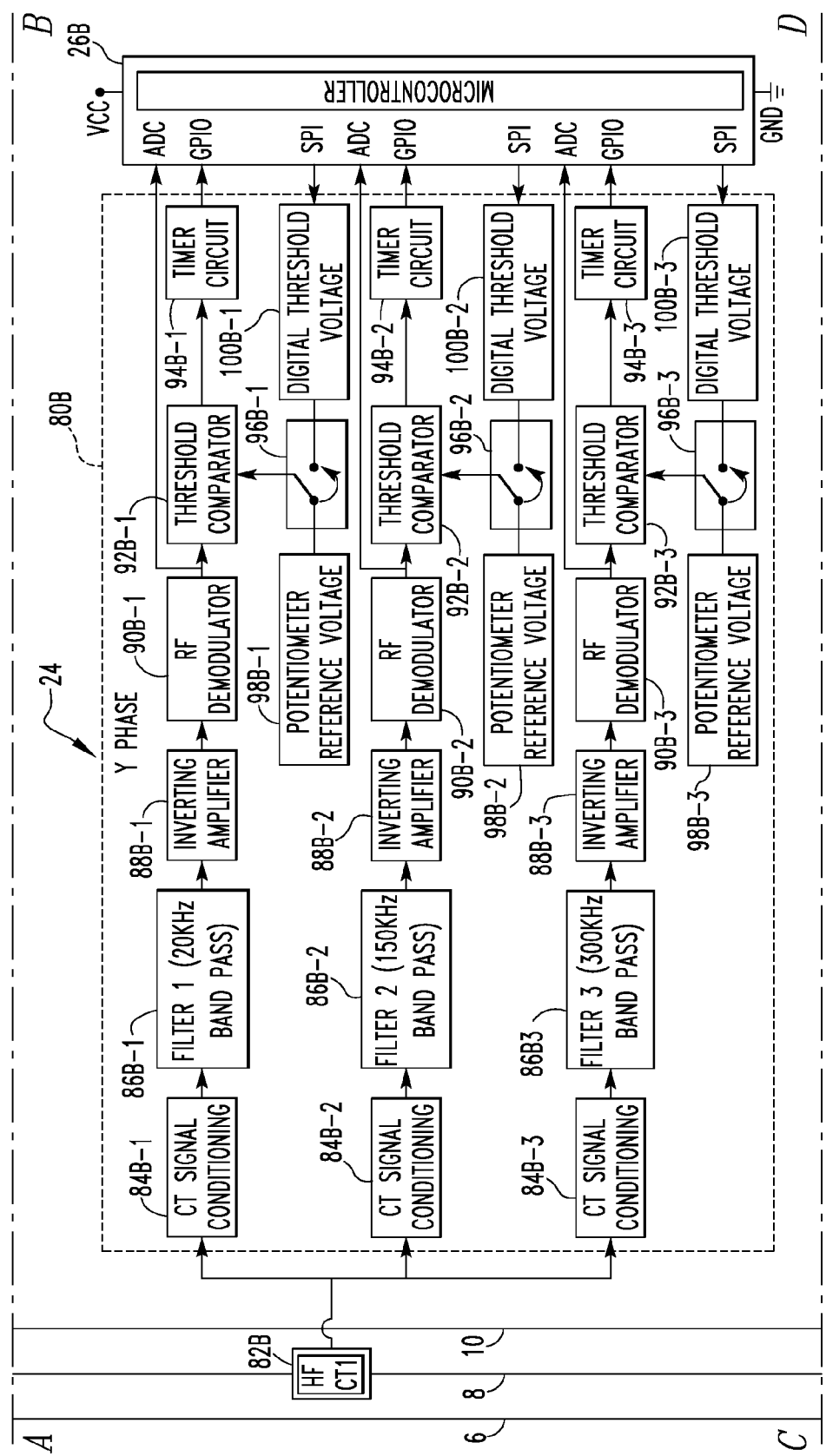
Figure 5C:
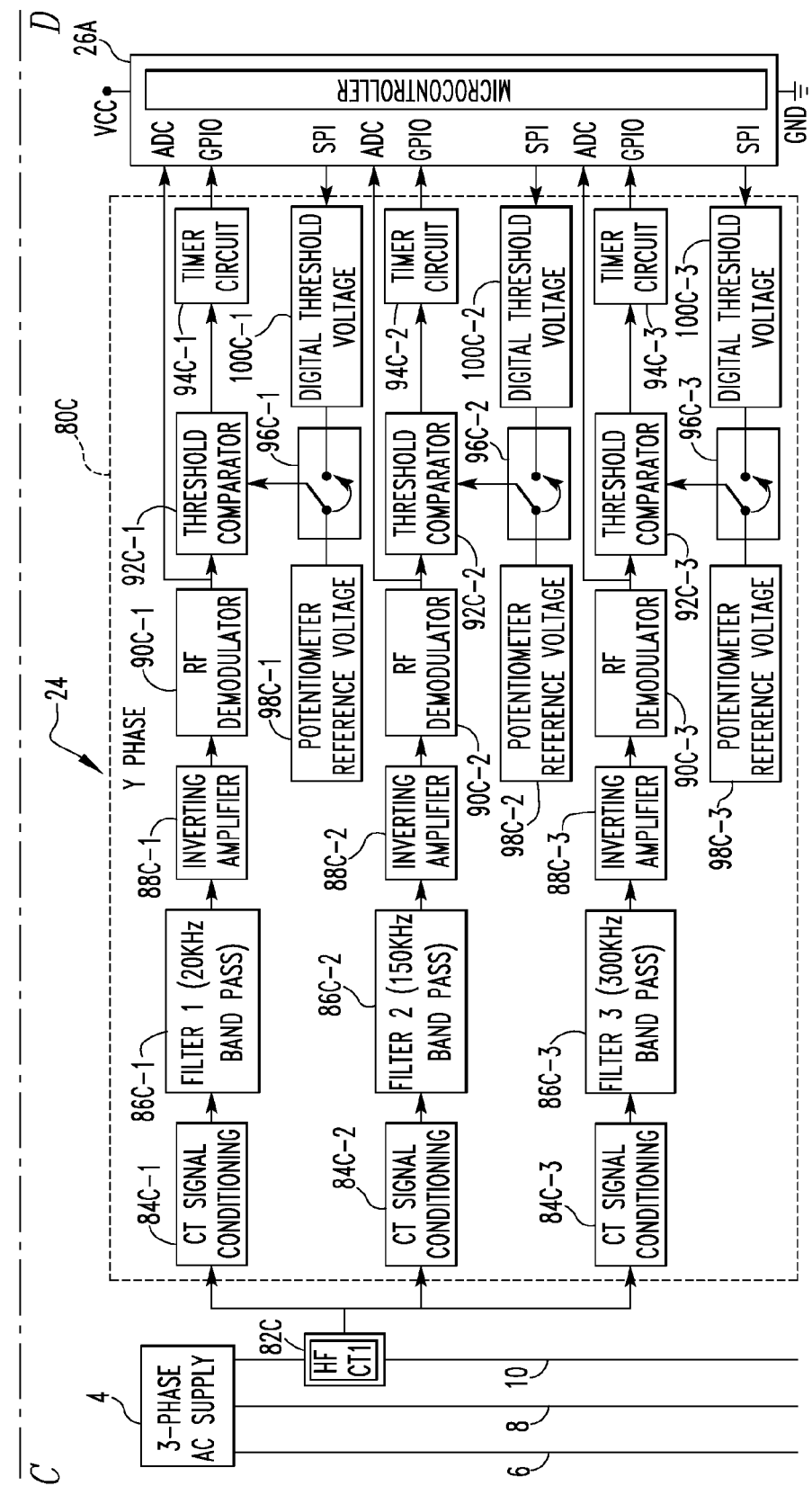

FIGS. 5A-5C are a schematic, block diagram of a portion of high voltage AC electrical system 2 and AC arc fault detection module 12 which shows the particular components of AC HF current section 24 in more detail. As seen in FIGS. 5A-5C, AC HF current section 24 includes three identically structured circuit modules 80, each associated with a particular phase R, Y, B of high voltage AC electrical system 2. More specifically, circuit modules 80 are labelled 80A, 80B and 80C, with circuit module 80A being associated with phase R and microcontroller 26A, circuit module 80B being associated with phase Y and microcontroller 26B, and circuit module 80C being associated with phase B and microcontroller 26C.

In addition, as seen in FIGS. 5A-5C, each circuit module 80A, 80B, 80C receives as an input the output of an associated current transformer 82A, 82B, 82C forming part of the sensors 18 shown in FIG. 1. In the exemplary embodiment, each current transformer 82A, 82B, 82C measures the "high frequency" current of the associated phase line 6, 8, 10 of 3-phase AC supply 4 (with the DC low frequency being removed). As used herein, the term "high frequency" shall mean about 10 kHz to about 1000 kHz. In one particular embodiment, each current transformer 82A, 82B, 82C is a toroidal transformer type current sensor, although it will be appreciated that other methods in mechanisms for measuring the current are also possible, such as, without limitation, a current shunt.

As noted above, each circuit module 80A, 80B and 80C has an identical internal structure, and thus for ease of description, only circuit module 80A will be described in detail herein. It will be appreciated, however, that the structure of circuit modules 80B and 80C is identical, and like components are labeled with like reference numerals.

As noted elsewhere herein, whenever an AC arc fault occurs, a significant amount of high frequency noise will be generated on phase lines 6, 8, 10. Based on statistical data analysis, it has been determined that certain bands of the high frequency spectrum contain the most useful information for detecting arc faults. According to an aspect of the disclosed concept, that frequency band has been determined to be from about 20 kHz to about 350 kHz. In addition, the high-frequency current measurements made herein utilize a plurality of particular sub-bands within that selected frequency band in order to minimize the likelihood of nuisance tripping. In the non-limiting exemplary embodiment shown in FIGS. 5A-5C, three narrow sub-bands are utilized, with the first sub-band being 10-30 kHz, the second sub-band being 140-160 kHz, and the third sub-band being 290-310 kHz. Thus, as seen in FIGS. 5A-5C, each circuit module 80 includes three identical circuit "paths", one for each frequency sub-band that is being utilized. Therefore, as described below, an aspect of each of those frequency sub-band paths includes band pass filtering the measured current signal in order to obtain only the portion of the signal in the sub-band of interest. Because the frequency sub-band paths are identical, only one such frequency sub-band path (i.e., the frequency sub-band path associated with the 10-30 kHz sub-band of circuit module 80A) will be described herein for ease of description. It will be understood, however, that the other frequency sub-band paths are identical in structure and functionality, and like components are labeled with like reference numerals.

As seen in FIGS. 5A-5C, the 10-30 kHz sub-band path of circuit module 80A includes a CT signal conditioning module 84A-1, which receives the analog output signal of current transformer 82A and conditions (e.g. filters and amplifies) that signal for further processing. The conditioned high-frequency current signal is then provided to a band pass filter 86A-1, which passes only the narrow sub-band associated with that frequency sub-band path (in the present example, the 10-30 kHz sub-band). The 10-30 kHz analog current signal output by band pass filter 88A-1 is provided to an inverting amplifier 88A-1, which scales the analog current signal. The inverting amplifier 88A-1 is coupled to an RF demodulator 90A-1. The RF demodulator 90A-1 converts the analog current signal output by inverting amplifier 88A-1 to a lower frequency signal for further processing. The signal output by RF demodulator 90A-1 has two components: an amplitude component and a time component. A condition where the amplitude component is above a certain threshold level for at least a certain threshold amount of time is indicative of an arc fault (such condition may be referred to as an arc fault RF signature). Thus, as seen in FIGS. 5A-5C, the 10-30 kHz sub-band path of circuit module 80A also includes a threshold comparator 92A-1 and a timer circuit 94A-1, the function of which is to detect such conditions (i.e., arc fault RF signatures) in the measured high-frequency current. In particular, the output of threshold comparator 92A-1 will be high for any time at which the signal output by RF demodulator 90A-1 is above a certain programmable threshold (equal to the certain threshold level indicative of an arc fault described above). The timer circuit 94A-1 monitors the output of threshold comparator 92A-1 and is structured to output a pulse only when the output of the threshold comparator 92A-1 has been high for at least a predetermined time (equal to the certain threshold amount of time indicative of an arc fault described above). As will be appreciated, that output pulse is an indication of a detected HF current arc fault condition and, as seen in FIGS. 5A-5C, is provided to a GPIO pin of microcontroller 26A. When such an indication is received by microcontroller 26A, it makes an AC HF current arc flag for the associated frequency sub-band (the 10-30 kHz sub-band in the present example) active. In one particular alternative exemplary embodiment, the output of timer circuit 94A-1 may be provided to a monostable multivibrator (not shown) in order to provide a mono-shot output and ensure that there is no glitch in the timer output.

In addition, the 10-30 kHz sub-band path of circuit module 80A includes a potentiometer 96A-1 that is coupled to a potentiometer reference voltage 98A-1 and a digital threshold control 100A-1 controlled by an output of microcontroller 26A. This configuration allows the detection threshold of threshold comparator 92A-1 to be selectively adjusted and programmed by microcontroller 26A. The manner in which this adjustment occurs according to an aspect of the disclosed concept is described in greater detail herein.

According to a further aspect of the disclosed concept which will now be described in detail, each microcontroller 26A, 26B, 26C is programmed to receive each of the signals as described herein and make a determination as to whether an arc fault has occurred on any of the phase lines 6, 8, 10 based on those inputs. As will be appreciated, a separate arc fault determination will be made for each of the phase lines 6, 8, 10 simultaneously, using the same decision logic for each determination (in each case, however, only the signals relevant to the phase line 6, 8, 10 in question are utilized).

Figure 6A:
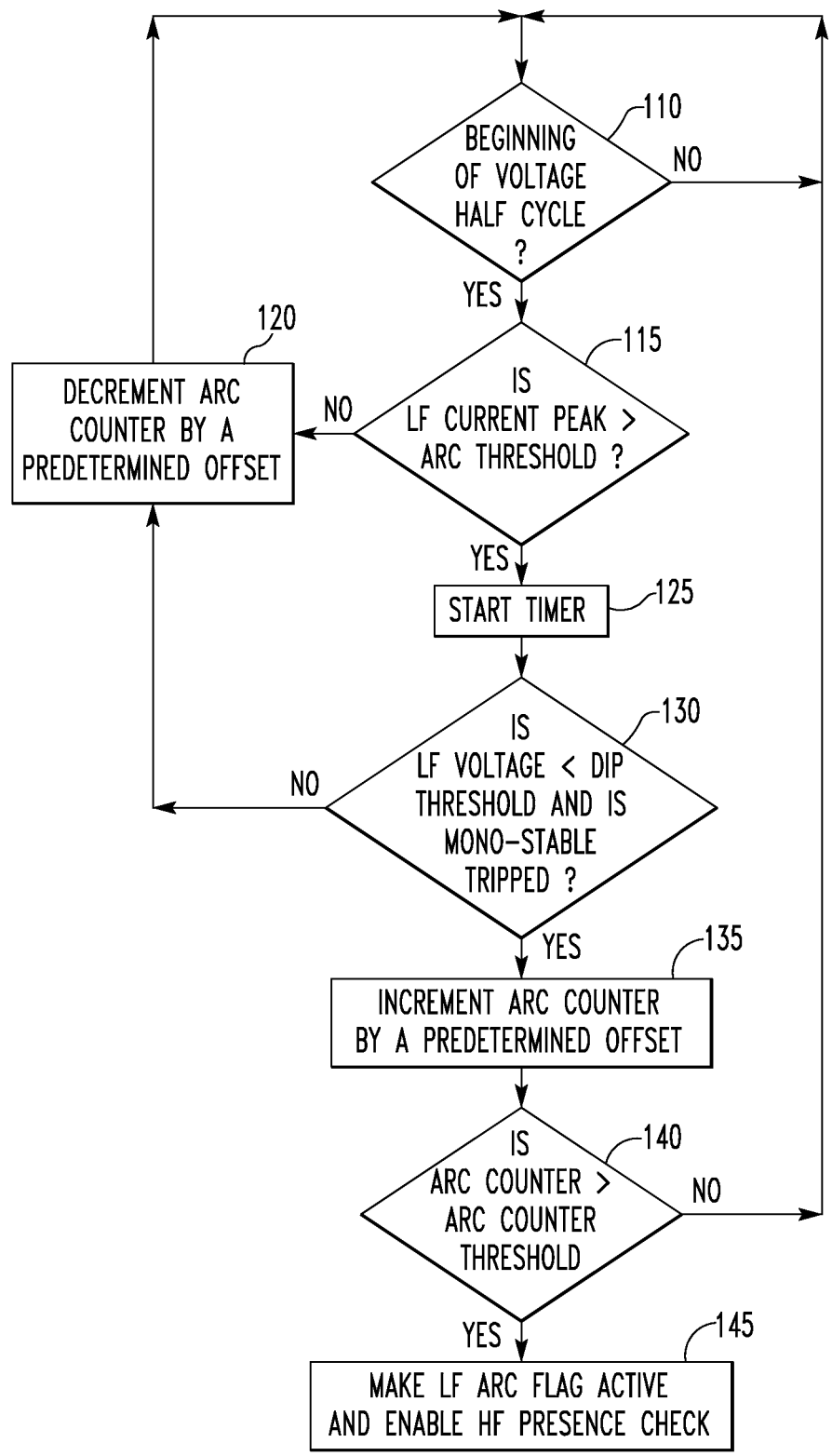
FIGS. 6A-6C are flowcharts showing a methodology of arc fault detection according to an embodiment of the disclosed concept.
Figure 6B:
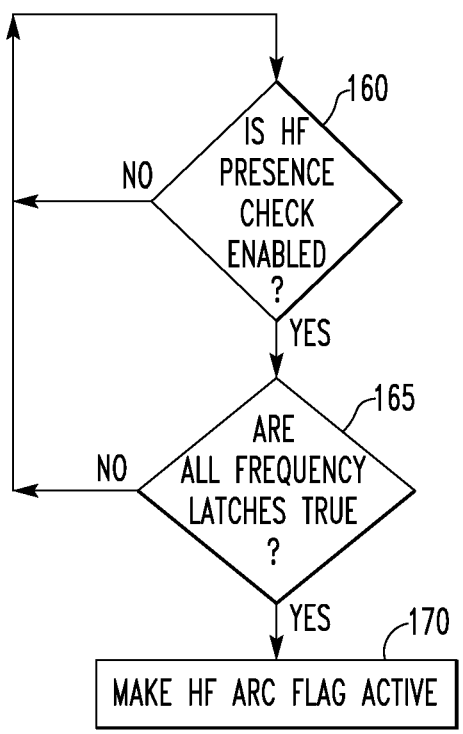
Figure 6C:
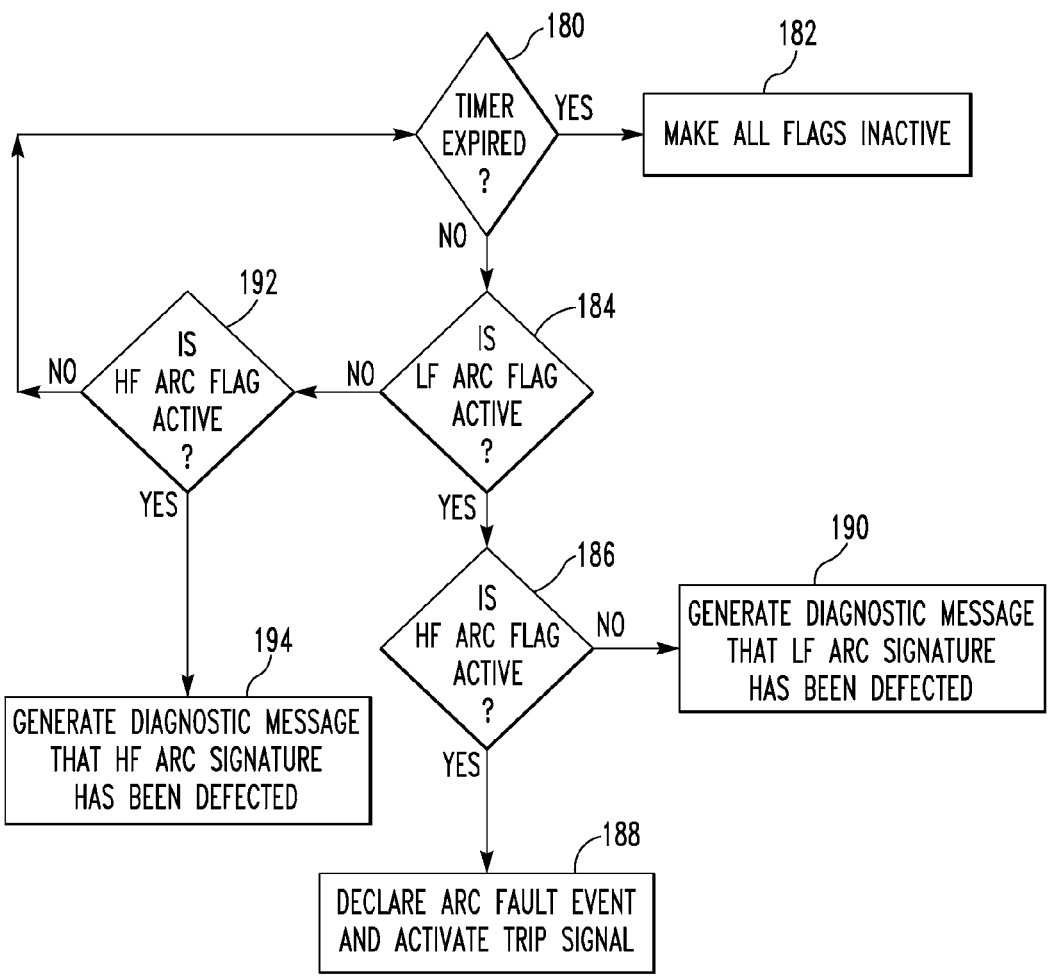

FIGS. 6A, 6B and 6C are flowcharts showing that decision logic for one particular, non-limiting exemplary embodiment of the disclosed concept. As will be appreciated, such decision logic may be implemented in one or more routines stored and executed by each microcontroller 26A, 26B, 26C. However, for ease of description purposes, that decision logic will be described in connection with phase line 6 and microcontroller 26A, although it will be understood that such description will apply equally to phase lines 8 and 10 and micro controllers 26B and 26C.

More specifically, FIG. 6A illustrates a methodology according to an aspect of the disclosed concept for determining when LF current signatures and LF voltage signatures indicative of an arc fault have been detected in AC LF current section 20 and AC LF voltage section 22 such that further analysis based on high-frequency current using information from AC HF current section 24 is warranted. In the exemplary embodiment, low frequency current is checked every half cycle of the AC voltage of phase line 6. Thus, the methodology of FIG. 6A begins at step 110, wherein a determination is made as to whether the beginning of a voltage half cycle has been detected. In the exemplary embodiment, this determination is made based upon the signal output by zero crossing detector 68A of AC LF voltage section 22 and provided to microcontroller 26A. If the answer at step 110 is no, then the method returns to step 110 to continue to wait for the beginning of a voltage half cycle. If the answer at step 110 is yes, then, at step 115, a determination is made as to whether the current peak value of the low frequency current as measured by AC LF current section 20 is greater than some predetermined arc threshold. In the exemplary embodiment, this determination is made using the output of the peak detector module 46A of AC LF current section 20 that is provided to microcontroller 26A. In the exemplary embodiment, the peak detector circuit portion is read about every quarter cycle of the voltage. In particular, in the exemplary embodiment, quarter cycle timing begins when the zero crossing detector 48A detects a "zero" crossing as described herein, and the duration of the quarter cycle timing is determined based upon the frequency of the AC supply voltage signal, which frequency is updated periodically using timers from the zero crossing detector 48A. At the end of the quarter cycle, multiple readings from peak detector 46A are made to avoid errors. If the answer at step 115 is no, then, at step 120, and arc counter maintained by microcontroller 26A is decremented by a predetermined offset value and the method then returns to step 110. If, however, the answer at step 115 is yes, then, at step 125, a timer is started. That timer implements a sliding window of predetermined duration (e.g. 100 ms in the exemplary embodiment) during which both low frequency voltage arc signatures and high-frequency current arc signatures must be detected in order to declare an arc fault as described herein. Following step 125, the method proceeds to step 130, wherein a determination is made as to whether the LF voltage as measured by AC LF voltage section 22 has indicated a dip by dropping below a predetermined dip threshold. In the exemplary embodiment, that determination is made based on the output of threshold crossing detector 70 A that is provided to microcontroller 26A. Also at step 130, a determination is made as to whether monostable multivibrator 72A has been tripped. If the answer at step 130 (to both questions) is no, then the method proceeds to step 120 as described above. If, however, the answer at step 130 is yes, meaning that a dip in voltage has been detected, the method proceeds to step 135. At step 135, the arc counter is incremented by a predetermined offset value. Next, at step 140, a determination is made as to whether the arc counter is greater than a predetermined arc counter threshold. If the answer is no, then the method returns to step 110. If, however, the answer at step 140 is yes, then microcontroller 26A makes an LF arc flag active and enables an HF presence check variable.

In the exemplary embodiment, the predetermined offset described above is calculated in such a way that it will automatically adjusts itself to an arc threshold crossing value or return to zero within a predetermined window, which in the exemplary embodiment is a 100 ms window (although this value may vary depending on applicable standards). In addition, in the exemplary embodiment the arc counter threshold is to correspond to five half cycles, which is based on an applicable standard.

FIG. 6B illustrates a methodology according to a further aspect of the disclosed concept for determining when AC HF current section 24 has made a determination that an arc signature is present for all of the frequency sub bands. The method begins at step 160, wherein a determination is made as to whether the HF presence check variable has been enabled (FIG. 6A). If the answer at step 160 is no, then the method returns to step 160 to continue monitoring this variable. If, however, the answer at step 160 is yes, meaning that the HF presence check variable has been enabled as a result of the steps of FIG. 6A described above, then the method proceeds to step 165. At step 165, a determination is made as to whether the AC HF current arc flag for the every frequency sub-band is active. In the illustrated embodiment, this is done by checking a number of frequency latches, wherein each frequency latch will be true only if the associated AC HF current flag has been made active. If the answer at step 165 is no, then the method returns to step 160. If, however, the answer at step 165 is yes, then the method proceeds to step 170, wherein microcontroller 26A makes an HF arc flag active, which flag indicates that AC HF current section 24 has made a determination that an arc signature is present for all of the frequency sub bands.

FIG. 6C illustrates a methodology for determining when to declare an arc fault event and activate a trip signal according to a further aspect of the disclosed concept. The method begins at step 180, wherein a determination is made as to whether the timer started in step 125 of FIG. 6A has expired. If the answer is yes, then, at step 182, all flags are made in active by microcontroller 26A. If the answer at step 180 is no, then, at step 184, a determination is made as to whether the LF arc flag is active. If the answer at step 184 is yes, then at step 186 a determination is made as to whether the HF arc flag is active. If the answer at step 186 is yes, then, at step 188, microcontroller 26A declares an arc fault event and a trip signal for tripping the appropriate operating mechanism 16 (FIG. 1) is generated. In particular, according to the exemplary embodiment, such a trip signal is provided to output driver section 34A (FIG. 2). Based on that signal, output driver section 34A will send an appropriate signal to the associated operating mechanism 16 in order to cause the associated separable contacts 14 to be opened. Output driver section 34A will also send a signal to the one or more LEDs 36A to cause the one or more LEDs 36A to provide a visual indication that arc fault condition has been detected in a trip has been initiated. Thus, as will be appreciated, a successful trip signal activation requires satisfaction of all of the LF arc fault and HF arc fault criteria within a valid window of predetermined duration, which in the exemplary embodiment is 100 ms.

If the answer at step 186 is no, then the method, in the illustrated embodiment, proceeds to step 190, wherein microcontroller 26A will generate a diagnostic message indicating that an LF arc signature has been detected (but that a trip has not been initiated because an HF arc signature has not also been detected). Such a message may be displayed by AC arc fault detection module 16 and/or communicated to another device such as a diagnostic computer system. If the answer at step 184 is no, then the method proceeds to step 192, wherein a determination is made as to whether the HF arc flag is active. If the answer is no then the method returns to step 180. If the answer is yes, then the method, in the illustrated embodiment, proceeds to step 194, wherein microcontroller 26A will generate a diagnostic message indicating that an HF arc signature has been detected (but that a trip has not been initiated because an LF arc signature has not also been detected). Such a message may be displayed by AC arc fault detection module 16 and/or communicated to another device such as a diagnostic computer system.

Figure 7:
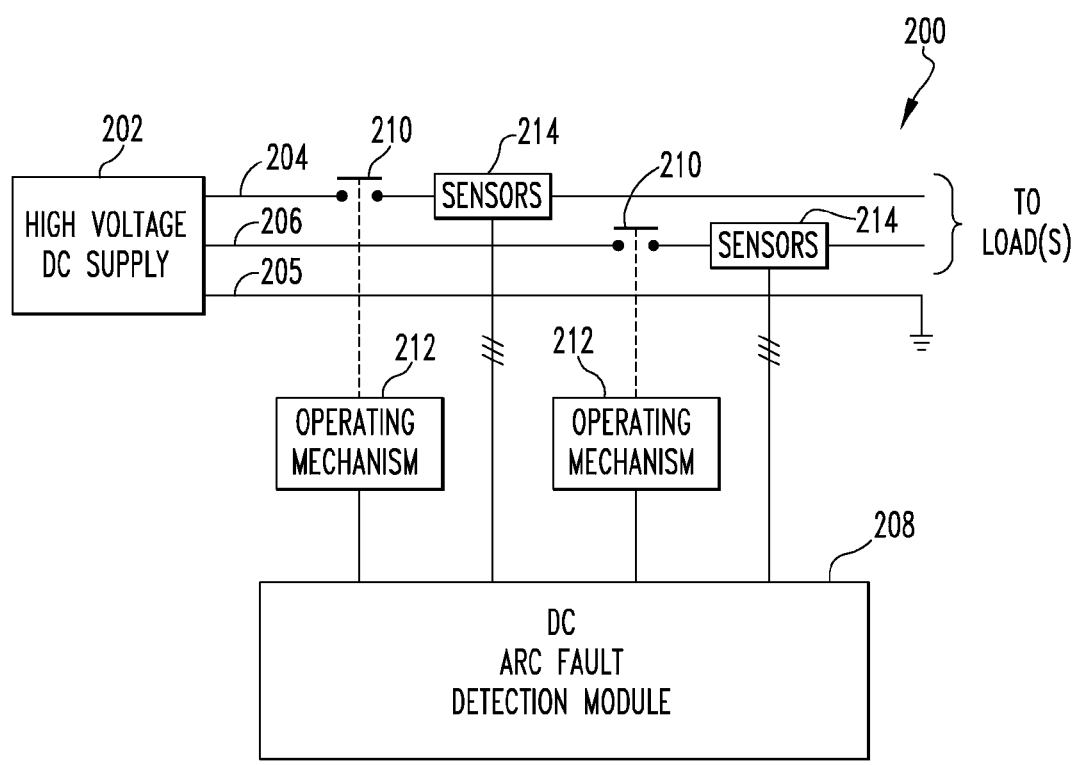
FIG. 7 is a schematic block diagram of a high voltage DC electrical system according to an exemplary embodiment of the disclosed concept.

FIG. 7 is a schematic block diagram of a high voltage DC electrical system 200 according to another exemplary embodiment of the disclosed concept, which may be, for example and without limitation, a "More Electric" high voltage DC aircraft electrical system. As seen in FIG. 7, high voltage DC electrical system 200 includes a high voltage DC supply 202, which may be, for example and without limitation, a 540 VDC supply having a +270 VDC line, a −270 VDC line and a common ground (see FIG. 10). In the illustrated, exemplary embodiment, high voltage DC supply 202 feeds a positive DC line 204 (e.g., +270 VDC) and a negative DC line 206 (e.g., −270 VDC) of high voltage DC electrical system 200. In addition, in the event a common ground is not available, then 540V and 0V may be sensed using a differential connection of +/−270V. Such a configuration will be implemented essentially as described herein, except that a change of the voltage threshold (described herein) will be required, only a single breaker switch will be employed, and only a single channel of sensors (FIGS. 9, 190 and 11A-11B) will be employed rather than multiple channels.

As seen in FIG. 7, high voltage DC electrical system 200 includes a DC arc fault detection module 208. DC arc fault detection module 208 is described in greater detail herein and is structured to provide protection against DC parallel arc faults in high voltage DC electrical system 200. In particular, each DC line 204, 206 is provided with a respective set of separable contacts 210 which are driven by an associated operating mechanism 212. Each DC line 204, 206 is also provided with a number of sensors 214 structured to measure various parameters of the associated DC line 204, 206 and provide information regarding the parameters measured thereby to DC arc fault detection module 208. Thus, as described in greater detail herein and according to an aspect of the disclosed concept, DC arc fault detection module 208 is structured to monitor both positive DC line 204 and negative DC line 206, and in response to detecting conditions indicative of a parallel arc fault thereon based on the measured parameters, cause the associated operating mechanism 212 to open the associated separable contacts 210 to extinguish the arc fault and protect high voltage DC electrical system 200 from the arc fault. In one embodiment, separable contacts 210, operating mechanisms 212, sensors 214, and DC arc fault detection module 208 may be provided within a circuit interrupter, such as a circuit breaker. In another embodiment, separable contacts 210, operating mechanism 212 and sensors 214 may be provided within a circuit interrupter, such as a circuit breaker or a solid state switch, and DC arc fault detection module 208 may be provided as an add-on module in the form of a separate unit.

Figure 8:
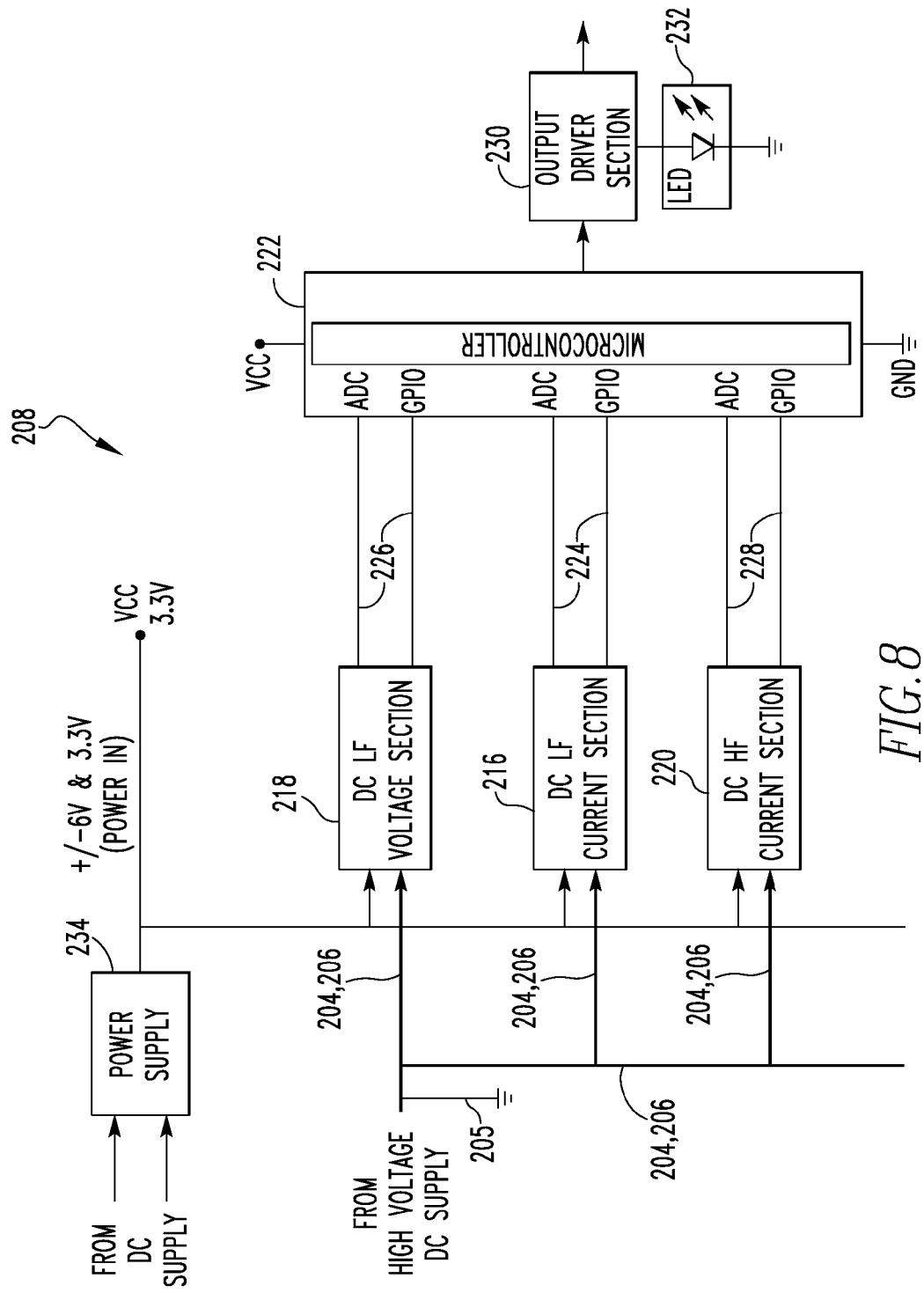
FIG. 8 is a top level, schematic block diagram of an DC arc fault detection module according to a non-limiting, exemplary embodiment of the disclosed concept.

FIG. 8 is a top level, schematic block diagram of DC arc fault detection module 208 according to a non-limiting, exemplary embodiment of the disclosed concept. DC arc fault detection module 208 includes a DC low frequency (LF) current section 216, a DC low frequency (LF) voltage section 218 and a DC high frequency (HF) current section 220, each of which is described in greater detail herein. Furthermore, DC arc fault detection module 208 includes a microcontroller 222 which is operatively coupled to DC LF current section 216, DC LF voltage section 218 and DC HF current section 220. While microcontroller 222 is shown in FIG. 8, it will be understood that that is not meant to be limiting and that alternative types of processing devices, such as, without limitation, a microprocessor or a programmable logic controller, may also be used.

As seen in FIG. 8, DC LF current section 216 has a number of outputs 224 (described in greater detail herein) which are provided as inputs to microcontroller 222. Similarly, DC LF voltage section 218 has a number of outputs 226 (described in greater detail herein) which are provided as inputs to microcontroller 222, and DC HF current section 220 has a number of outputs 228 (described in greater detail herein) which are provided as inputs to microcontroller 222. As described in greater detail herein, microcontroller 222 is structured and configured to detect the presence of a DC parallel arc fault on either of positive DC line 204 or negative DC line 206 (relative to ground line 205) using the inputs just described. More specifically, as is known in the art, when a DC arc fault occurs, the following also occurs within the associated electrical system: (i) a sudden rise in DC current, (ii) a dip in DC voltage that is synchronous with the sudden rise in DC current, and (ii) generation of a significant amount of high-frequency noise. As described in greater detail herein, DC LF current section 216 functions to monitor the DC current of high voltage DC supply 202 and look for such sudden rises in DC current, DC LF voltage section 218 functions to monitor the DC voltage of high voltage DC supply 202 and look for such dips in DC voltage, and DC HF current section 220 functions to monitor the DC current of high voltage DC supply 202 and look for evidence of such high-frequency noise in certain selected frequency bands. As described in greater detail herein, all of this information is then used as part of an overall arc fault detection methodology of DC arc fault detection module 208 to detect actual arc faults (i.e., non-nuisance faults) and take appropriate action to protect high voltage DC electrical system 200.

DC arc fault detection module 208 further includes an output driver section 230 and a number of LEDs 232 coupled to microcontroller 222. The function of each of these components is described in greater detail elsewhere herein.

Finally, DC arc fault detection module 208 includes a power supply 234 that receives DC power from a DC supply, such as, without limitation, a 28V DC isolated supply, and outputs a number of power signals (e.g., a VCC of 3.3V DC) for powering the various electronic components of DC arc fault detection module 208. Alternatively, power for the electronic components of DC arc fault detection module 208 can be provided using high voltage DC supply 202 rather than a separate, additional 28V DC isolated supply.

Figure 9:
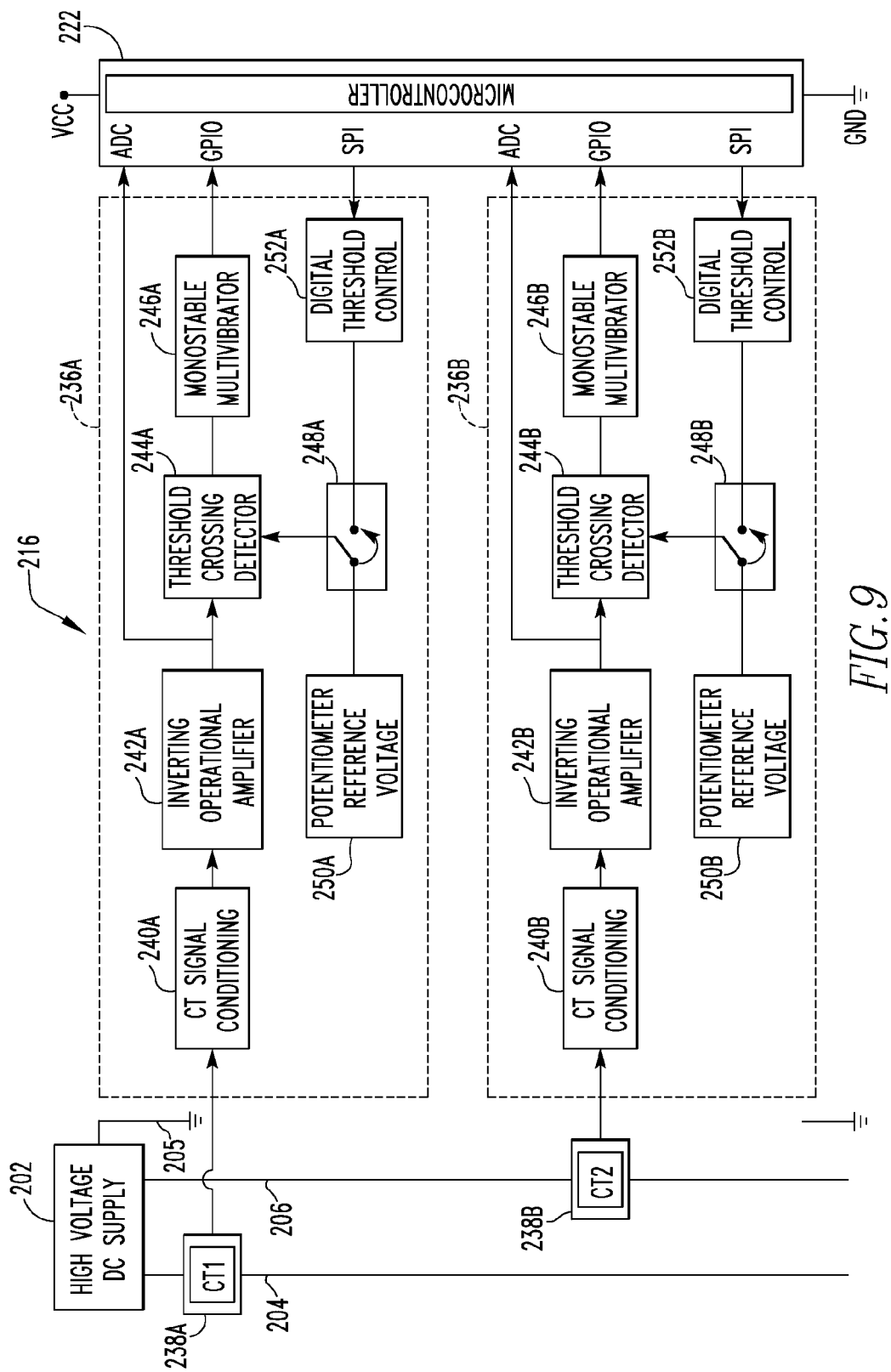
FIG. 9 is a schematic, block diagram of a portion of the high voltage DC electrical system of FIG. 7 and the DC arc fault detection module of FIG. 8 which shows the particular components of the DC LF current section in more detail.

FIG. 9 is a schematic, block diagram of a portion of high voltage DC electrical system 200 and DC arc fault detection module 208 which shows the particular components of DC LF current section 216 in more detail. As seen in FIG. 9, DC LF current section 216 includes two identically structured circuit modules 236, each associated with a particular one of the DC lines 204, 206. More specifically, circuit modules 236 are labelled 236A and 236B, with circuit module 236A being associated with positive DC line 204 and circuit module 236B being associated with negative DC line 206. In addition, each circuit module 236A, 236B receives as an input the output of an associated current transformer 238A, 238B forming part of the sensors 214 shown in FIG. 7. In the exemplary embodiment, each current transformer 238A, 238B measures the "low frequency" current of the associated DC line 204, 206 of high voltage DC supply 202. As used herein, the term "low frequency" shall refer to the DC current of high voltage DC supply 202. In one particular embodiment, each current transformer 238A, 238B is a Hall effect type current sensor, although it will be appreciated that other methods in mechanisms for measuring the current are also possible, such as, without limitation, a current shunt.

As noted above, each circuit module 236A, 236B has an identical internal structure and identical functionality, and thus for ease of description, only circuit module 236A will be described in detail herein. It will be appreciated, however, that the structure and functionality of circuit module 236B is identical, and like components are labeled with like reference numerals.

As seen in FIG. 9, circuit module 236A includes a CT signal conditioning module 240A, which receives the analog output signal of current transformer 238A and conditions (e.g., filters and amplifies) that signal for further processing. Circuit module 236A further includes an inverting operational amplifier 242A that is coupled to and receives the conditioned signal output from CT signal conditioning circuitry 240A. Inverting operational amplifier 242A scales the conditioned current signal output from CT signal conditioning circuitry 240A so that DC arc fault detection module 208 can be used for different load currents without altering the structure thereof. That scaled analog current signal is provided to an ADC pin of microcontroller 222 for use thereby as described elsewhere herein. Also, a threshold crossing detector module 244A is coupled to and receives the output of inverting operational amplifier 242A. Threshold crossing detector 244A compares the scaled current signal it receives to a programmable threshold in order to detect sudden rises in DC current that are indicative of DC arc faults as described herein (i.e., a DC LF fault indication is registered if the DC current crosses the threshold). The output of threshold crossing detector 244A is provided to a monostable multivibrator 246A which is tuned to respond only to the arc fault DC low frequency digital signal from the comparator of the threshold crossing detector 244A and not to any nuisance or noise signals. As will be appreciated, arc fault event sensing needs precise synchronization of current and voltage signals. Monostable multivibrator 246A provides a one-shot output ("mono-shot") such that even under the presence of noise, the threshold crossing point of the DC current can be precisely timed, with an indication thereof (i.e., a pulse signal output by monostable multivibrator 246A) being provided to a GPIO pin of microcontroller 222 (as an LF current arc fault indicator). When such an indication is received by microcontroller 222, it makes a DC LF current arc flag active.

In addition, circuit module 236A includes a potentiometer 248A that is coupled to a potentiometer reference voltage 250A and a digital threshold control 252A controlled by an output of microcontroller 222. This configuration allows the detection threshold of threshold crossing detector 244A to be selectively adjusted and programmed by microcontroller 222. In the exemplary embodiment, the threshold is set to approximately 5 times the load current.

Figure 10:
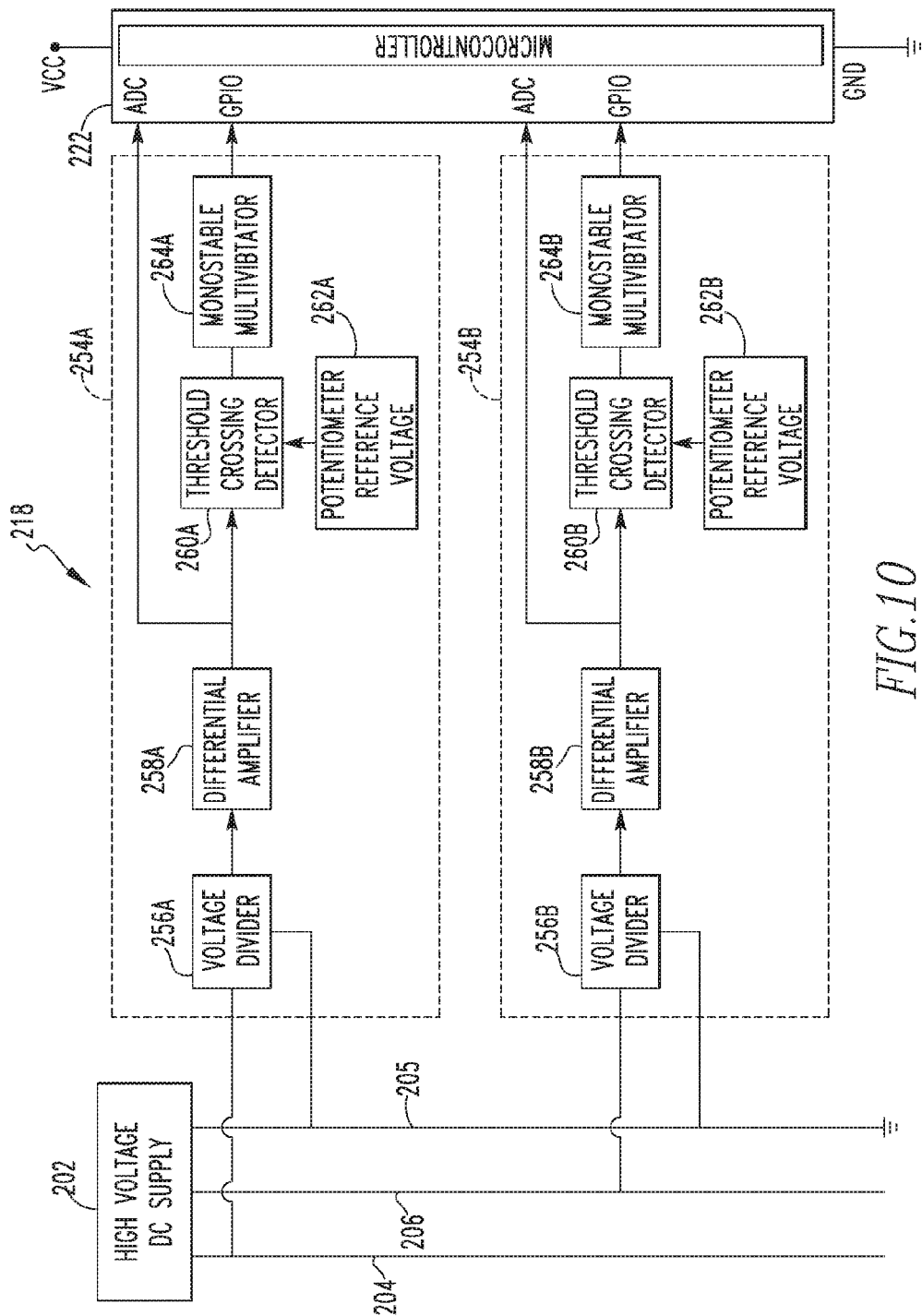
FIG. 10 is a schematic, block diagram of a portion of the high voltage DC electrical system of FIG. 7 and the DC arc fault detection module of FIG. 8 which shows the particular components of the DC LF voltage section in more detail.

FIG. 10 is a schematic, block diagram of a portion of high voltage DC electrical system 200 and DC arc fault detection module 208 which shows the particular components of DC LF voltage section 218 in more detail. As seen in FIG. 10, DC LF voltage section 218 includes two identically structured circuit modules 254, each associated with a particular one of the DC lines 204, 206. More specifically, circuit modules 254 are labelled 254A and 254B, with circuit module 254A being associated with positive DC line 204 (e.g., +270V DC) and circuit module 254B being associated with negative DC line 206 (e.g., −270V DC). As noted above, each circuit module 254A, 254B has an identical internal structure and an identical functionality, and thus for ease of description, only circuit module 254A will be described in detail herein. It will be appreciated, however, that the structure and functionality of circuit module 254B is identical, and like components are labeled with like reference numerals.

As seen in FIG. 10, circuit module 254A includes a voltage divider 256A which senses the voltage of positive DC line 204 in a floating configuration. The output of voltage divider 256A is provided to a differential amplifier 258A, which converts the floated (differential) signal output of voltage divider 256A to a single ended analog voltage signal on the common electrical ground of microcontroller 222. The analog voltage signal output of differential amplifier 258A is provided to an ADC pin of microcontroller 222. The analog voltage signal output of differential amplifier 258A is also provided to a threshold crossing detector 260A. Threshold crossing detector 260A compares the analog voltage signal it receives to a predetermined threshold based on potentiometer reference voltage 262A in order to detect dips in DC voltage that are indicative of DC arc faults as described herein (i.e., a DC LF fault indication is registered if the DC voltage crosses the predetermined threshold). The output of threshold crossing detector 260A is provided to a monostable multivibrator 264A which is tuned to respond only to the arc fault DC low frequency digital voltage signal from the comparator of the threshold crossing detector 260A and not to any nuisance or noise signals. Monostable multivibrator 264A provides a one-shot output (mono-shot) such that even under the presence of noise, the threshold crossing point of the DC voltage can be precisely timed, with an indication thereof (a pulse signal output by monostable multivibrator 264A) being provided to a GPIO pin of microcontroller 222 (as an LF voltage arc fault indicator). When such an indication is received by microcontroller 222, it makes a DC LF voltage arc flag active.

Figure 11A:
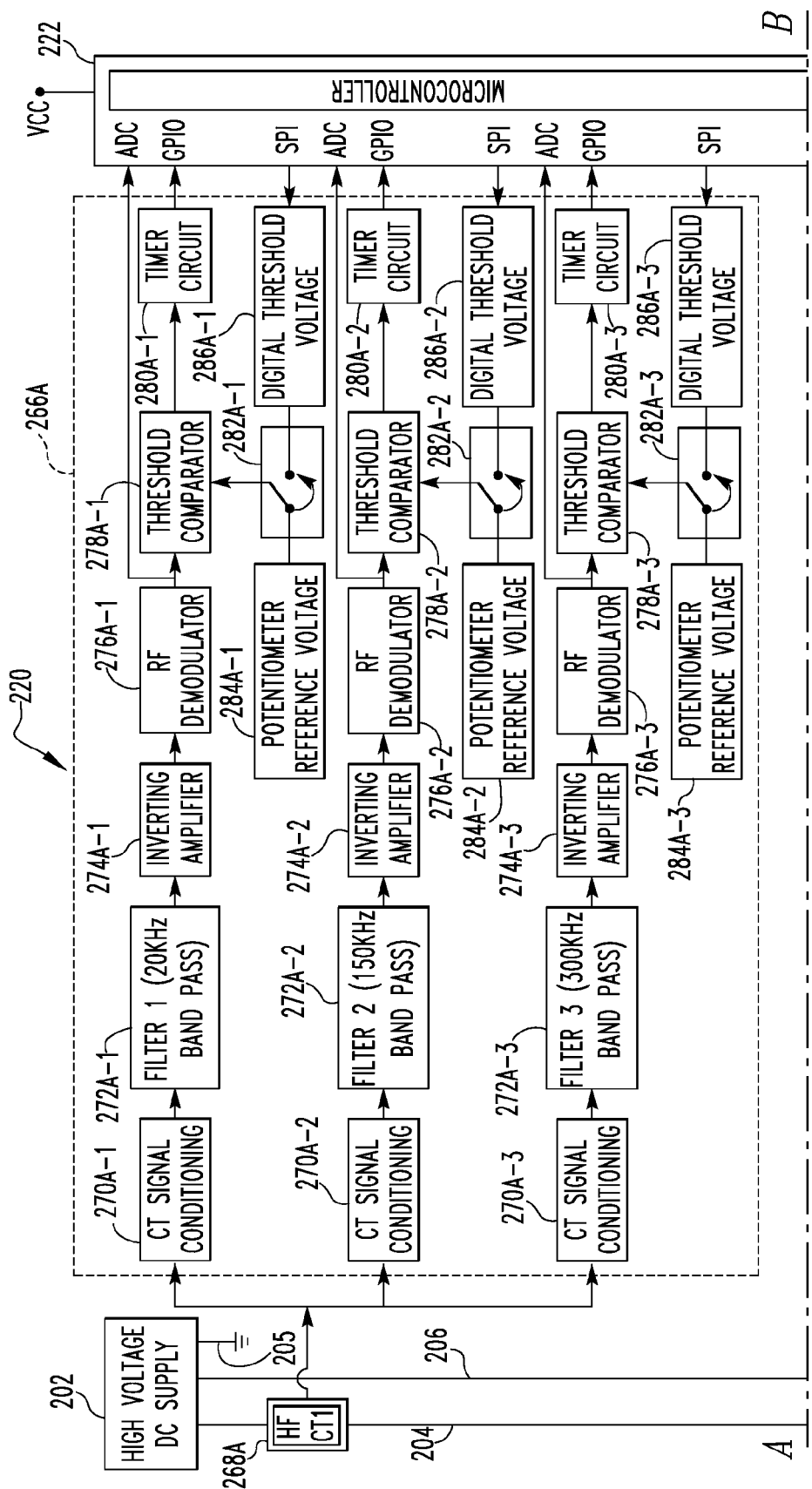
FIGS. 11A-11B are a schematic, block diagram of a portion of the high voltage DC electrical system of FIG. 7 and the DC arc fault detection module of FIG. 8 which shows the particular components of the DC HF current section 24 in more detail.
Figure 11B:
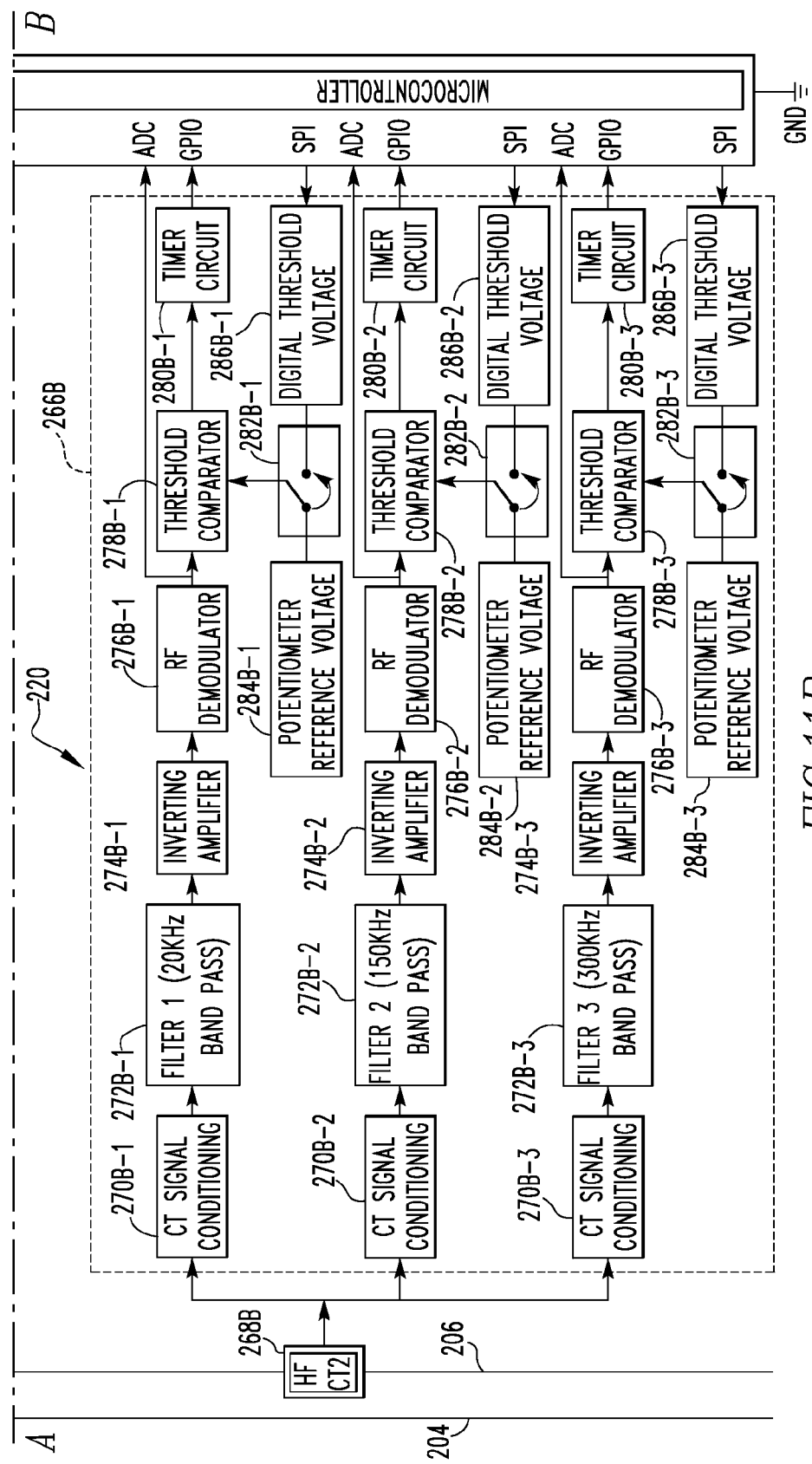

FIGS. 11A-11B are a schematic, block diagram of a portion of high voltage DC electrical system 200 and DC arc fault detection module 208 which shows the particular components of DC HF current section 220 in more detail. As seen in FIGS. 11A-11B, DC HF current section 220 includes two identically structured circuit modules 266, each associated with a particular one of the DC lines 204, 206. More specifically, circuit modules 266 are labelled 266A and 266B, with circuit module 266A being associated with positive DC line 204 and circuit module 266B being associated with negative DC line 206. In addition, as seen in FIGS. 11A-11B, each circuit module 266A, 266B receives as an input the output of an associated current transformer 268A, 268B forming part of the sensors 214 shown in FIG. 7. In the exemplary embodiment, each current transformer 268A, 268B measures the "high frequency" current of the associated DC line 204, 206 of high voltage DC supply 202 (with the DC low frequency being removed). As used herein, the term "high frequency" shall mean about 10 kHz to about 1000 kHz. In one particular embodiment, each current transformer 268A, 268B is a toroidal transformer type current sensor, although it will be appreciated that other methods in mechanisms for measuring the current are also possible, such as, without limitation, a current shunt.

As noted above, each circuit module 266A, 266B has an identical internal structure and identical functionality, and thus for ease of description, only circuit module 266A will be described in detail herein. It will be appreciated, however, that the structure and functionality of circuit module 266B is identical, and like components are labeled with like reference numerals.

As noted elsewhere herein, whenever a DC arc fault occurs, a significant amount of high frequency noise will be generated on DC lines 204, 206. Based on statistical data analysis, it has been determined that certain bands of the high frequency spectrum contain the most useful information for detecting arc faults. According to an aspect of the disclosed concept, that frequency band has been determined to be from about 20 kHz to about 350 kHz. In addition, the high-frequency current measurements made herein utilize a plurality of particular sub-bands within that selected frequency band in order to minimize the likelihood of nuisance tripping. In the non-limiting exemplary embodiment shown in FIGS. 11A-11B, three narrow sub-bands are utilized, with the first sub-band being 10-30 kHz, the second sub-band being 140-160 kHz, and the third sub-band being 290-310 kHz. Thus, as seen in FIGS. 11A-11B, each circuit module 266 includes three identical circuit "paths", one for each frequency sub-band that is being utilized. Therefore, as described below, an aspect of each of those frequency sub-band paths includes band pass filtering the measured current signal in order to obtain only the portion of the signal in the sub-band of interest. Because the frequency sub-band paths are identical, only one such frequency sub-band path (i.e., the frequency sub-band path associated with the 10-30 kHz sub-band of circuit module 266A) will be described herein for ease of description. It will be understood, however, that the other frequency sub-band paths are identical in structure and functionality, and like components are labeled with like reference numerals.

As seen in FIGS. 11A-11B, the 10-30 kHz sub-band path of circuit module 266A includes a CT signal conditioning module 270A-1, which receives the analog output signal of current transformer 268A and conditions (e.g. filters and amplifies) that signal for further processing. The conditioned high-frequency current signal is then provided to a band pass filter 272A-1, which passes only the narrow sub-band associated with that frequency sub-band path (in the present example, the 10-30 kHz sub-band). The 10-30 kHz analog current signal output of band pass filter 272A-1 is provided to an inverting amplifier 274A-1, which scales the analog current signal. The inverting amplifier 274A-1 is coupled to an RF demodulator 276A-1. The RF demodulator 276A-1 converts the analog current signal output of inverting amplifier 274A-1 to a lower frequency signal for further processing. The signal output of RF demodulator 276A-1 has two components: an amplitude component and a time component. A condition where the amplitude component is above a certain threshold level for at least a certain threshold amount of time is indicative of an arc fault (such condition may be referred to as an arc fault RF signature). Thus, as seen in FIGS. 11A-11B, the 10-30 kHz sub-band path of circuit module 266A also includes a threshold comparator 278A-1 and a timer circuit 280A-1 (which may be coupled at its output to a monostable multivibrator (not shown), the function of which is to detect such conditions (i.e., arc fault RF signatures) in the measured high-frequency current. In particular, the output of threshold comparator 278A-1 will be high for any time at which the signal output of RF demodulator 276A-1 is above a certain programmable threshold (equal to the certain threshold level indicative of an arc fault described above). The timer circuit 280A-1 monitors the output of threshold comparator 278A-1 and is structured to output a pulse only when the output of the threshold comparator 278A-1 has been high for at least a predetermined time (equal to the certain threshold amount of time indicative of an arc fault described above). As will be appreciated, that output pulse is an indication of a detected HF current arc fault condition and, as seen in FIGS. 11A-11B, is provided to a GPIO pin of microcontroller 222. When such an indication is received by microcontroller 222, it makes a DC HF current arc flag for the associated frequency sub-band (the 10-30 kHz sub-band in the present example) active. In one particular alternative exemplary embodiment, the output of timer circuit 280A-1 may be provided to a monostable multivibrator (not shown) in order to provide a mono-shot output and ensure that there is no glitch in the timer output.

In addition, the 10-30 kHz sub-band path of circuit module 266A includes a potentiometer 282A-1 that is coupled to a potentiometer reference voltage 284A-1 and a digital threshold control 286A-1 controlled by an output of microcontroller 222. This configuration allows the detection threshold of threshold comparator 278A-1 to be selectively adjusted and programmed by microcontroller 222. The manner in which this adjustment occurs according to an aspect of the disclosed concept is described in greater detail herein.

According to a further aspect of the disclosed concept which will now be described in detail, microcontroller 222 is programmed to receive each of the digital inputs provided on the GPIO pins as described herein and make a determination as to whether an arc fault has occurred on either positive DC line 204 or negative DC line 206 based on those inputs. As seen in FIGS. 9-11, those inputs will include: (1) the output of monostable multivibrator 246A which indicates whether the DC current on positive DC line 204 has suddenly increased above a certain threshold, (2) the output of monostable multivibrator 246B which indicates whether the DC current on negative DC line 206 has suddenly increased above a certain threshold, (3) the output of monostable multivibrator 264A which indicates whether the DC voltage on positive DC line 204 has dipped below a certain threshold, (4) the output of monostable multivibrator 264B which indicates whether the DC voltage on negative DC line 206 has dipped below a certain threshold, (5) the output of each of the timer circuits 280A of circuit module 266A which indicates whether the high-frequency DC current of positive DC line 204 in the associated frequency band has been above a certain threshold for at least a certain period of time, and (6) the output of each of the timer circuits 280B of circuit module 266B which indicates whether the high-frequency DC current of negative DC line 206 in the associated frequency band has been above a certain threshold for at least a certain period of time. Thus, in the illustrated, exemplary embodiment, the arc fault determination for positive DC line 204 will be based on a total of five digital inputs and the arc fault determination for negative DC line will be based on a total of five digital inputs.

As will be appreciated, a separate arc fault determination will be made for each of positive DC line 204 and negative DC line 206 simultaneously, using the same decision logic for each determination (in each case, however, only the signals relevant to the DC line 204, 206 in question are utilized). Furthermore, as described herein, microcontroller 222 activates and deactivates certain flags based upon the digital inputs it receives, and the decision logic employed for arc fault detection utilizes those flags.

Figure 12:
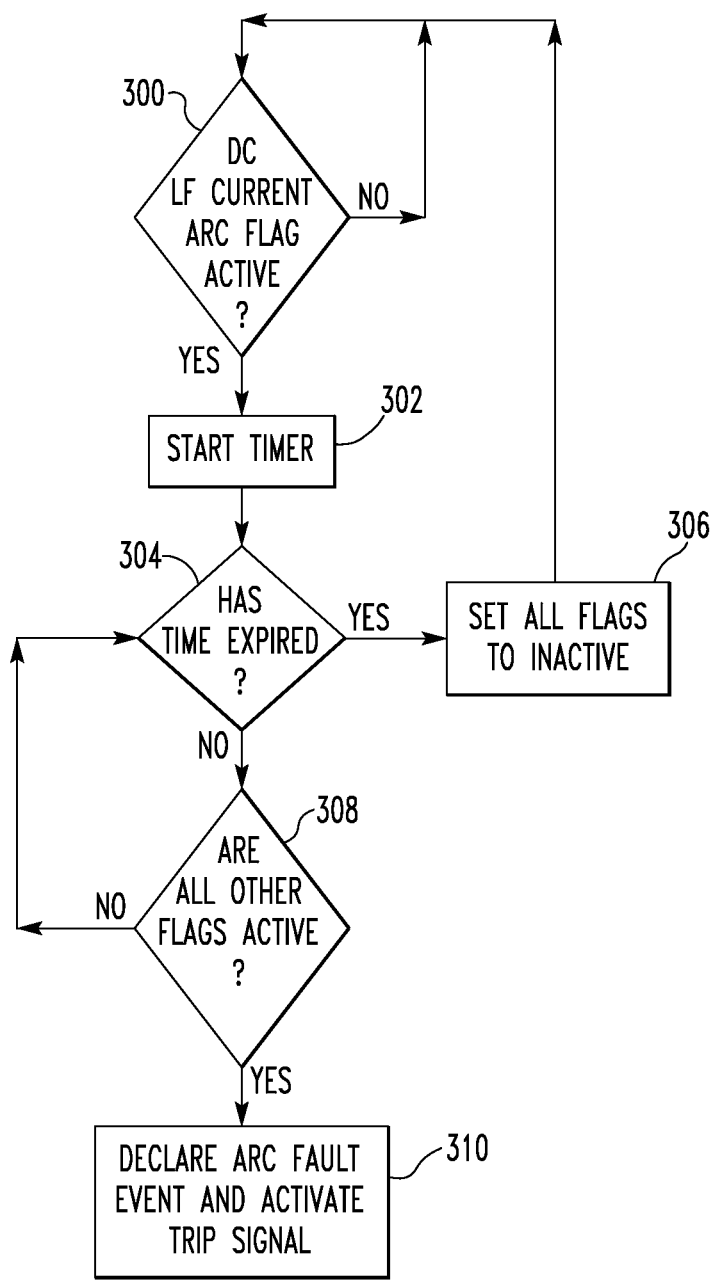
FIG. 12 is a flowchart showing a methodology of arc fault detection according to another embodiment of the disclosed concept.

FIG. 12 is a flowchart showing that decision logic for one particular, non-limiting exemplary embodiment of the disclosed concept. As will be appreciated, such decision logic may be implemented in one or more routines stored and executed by microcontroller 222. The decision logic begins at step 300, wherein a determination is made as to whether the DC LF current arc flag for the DC line in question is active. If the answer is no, then the method returns to step 300 to continue to monitor the status of that flag. If, however, the answer at step 300 is yes, then the decision logic proceeds to step 302. At step 302, a timer of a predetermined duration (e.g., without limitation, 100 ms) is started. Next, at step 304, a determination is made as to whether the timer has expired. If the answer is yes, then at step 306 all of the flags for the DC line in question are set to an inactive state and the decision logic returns to step 300. If, however, the answer at step 304 is no, then the method proceeds to step 308. At step 308, a determination is made as to whether all of the other flags for the DC line in question maintained by microcontroller 222 (i.e. the DC LF voltage arc flag and the DC HF current arc flag for each frequency sub band) are active. If the answer at step 308 is no, then the decision logic returns to step 304 for further processing. If, however, the answer at step 308 is yes, meaning that all of the flags for the DC line in question maintained by microcontroller 222 are active, then the decision logic proceeds to step 310. At step 310, and actual arc fault event is declared and a trip signal for tripping the appropriate operating mechanism 212 (FIG. 7) is generated. In particular, according to the exemplary embodiment, such a trip signal is provided to output driver section 230 (FIG. 8). Based on that signal, output driver section 230 will send an appropriate signal to the associated operating mechanism 212 in order to cause the associated separable contacts 210 to be opened. Output driver section 230 will also send a signal to the one or more LEDs 232 to cause the one or more LEDs 232 to provide a visual indication that an arc fault condition has been detected and a trip has been initiated.

The use of multiple frequencies sub-band by DC HF current section 220 as described herein is an important aspect of the disclosed concept as it is particularly useful for avoiding nuisance tripping. In particular, if only a single frequency band were to be used, signals in that band could be generated due to noise or due to some other load emission, which may result in nuisance tripping. Instead, as described herein, the present inventors have identified a particular high-frequency band (e.g., 10 kHz-300 kHz or 20 kHz-250 kHz) that includes a strong high-frequency presence due to arc faults. Analyzing that entire band of frequencies would require a significant amount of computation. However, as described herein, the disclosed concept instead samples that entire spectrum using three relatively narrow frequency sub-bands, and simultaneously sampling those 3 frequency sub-bands has been found to give an accurate determination of the presence of arc faults. As described in detail herein, the accuracy is further augmented by also requiring the presence of LF current and voltage signatures in order to declare an actual arc fault condition. Furthermore, according to an aspect of the disclosed concept, the frequency sub-bands are implemented in the form of hardware outside of microcontroller 222. This allows the use of a relatively simple, low-cost microcontroller. In contrast, implementing the frequency sub-bands inside of a microcontroller requires a high end processor with digital filters, memory and real-time ability to present outputs in the required response time.

As noted elsewhere herein, another important aspect of the disclosed concept, both in the AC and the DC implementation, is the fact that the thresholds for generating indicators of arc faults based on both low frequency and high-frequency current measurements as described herein are adjustable based on background noise estimations and customer load current (customer use) estimations. More particularly, according to an aspect of the disclosed concept, microcontrollers 26A, 26B and 26C and microcontroller 222 will continuously monitor background noise on AC LF and AC HF current channels and the DC LF and DC HF current channels, respectively, based on the analog current signals that are provided to microcontrollers 26A, 26B and 26C and microcontroller 222 (FIGS. 3, 5, 9 and 11). Microcontrollers 26A, 26B and 26C and Microcontroller 222 will also continuously estimate the load current being used by the customer. Microcontrollers 26A, 26B and 26C and Microcontroller 222 will then, using an algorithm, generate signals for adjusting the thresholds of the threshold comparators 92 and 278 of the AC and DC HF current sections 24 and 220, respectively, that are based on the background noise estimations and statistical customer use/load current estimations made by microcontrollers 26A, 26B and 26C and microcontroller 222 Adjustments may also be made to the thresholds of the LF current sections also described herein.

According to one particular exemplary embodiment, the threshold levels of the threshold comparators 92 and 278 set to an initial, default value that is based on statistical analysis of data. In particular, one or more of the following types of data may be used to estimate background noise and thus establish the initial threshold levels for threshold comparators 92 and 278: (i) historical arc fault noise level data obtained by performing statistical analysis and processing on historical arc fault data including noise data levels; (ii) estimated background noise levels obtained during a learning mode by measuring background noise under no arc conditions; (iii) probable background noise levels based on electromagnetic compatibility (EMC) standards for the particular application in question; and (iv) data regarding known noise emission signatures for the particular application in question (for example, the FAA has a database for noise emission signatures for a number of particular applications). Thereafter, when AC arc fault detection module 12 and/or DC arc fault detection module 208 are used, the analog signals from the DC LF and DC HF current channels thereof are periodically sampled and processed to create updated background noise information (for each sub-band) that is then used to create updated thresholds (for each sub-band). In the non-limiting exemplary embodiment, this processing employs a moving average method. This implementation is particularly useful in applications, such as "more electric" aircraft applications where the standards and probable loads are not known and sufficient test data does not exist. Furthermore, with this implementation, particular modules for particular applications do not need to be manufactured with specific thresholds, as the modules will automatically learn and adjust the appropriate thresholds over time.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An arc fault detection module for detecting arc faults in a DC electrical system having a DC supply line, comprising:
   a current detecting section having at least one output, the current detecting section being structured to determine whether at least one signal based on a current measured from the DC supply line exceeds at least one corresponding predetermined threshold level and cause the at least one output to indicate that the at least one corresponding predetermined threshold level has been exceeded in response to detecting that the at least one signal based on the current measured from the DC supply line exceeds the at least one corresponding predetermined threshold level; and
   a processing device structured and configured with an algorithm to: (i) receive the at least one output, (ii) determine whether an arc fault in the DC electrical system has occurred based on at least the at least one output, (iii) determine an estimation of background noise based on at least one signal indicative of a current on the DC supply line, and (iv) adjust the at least one corresponding predetermined threshold level based on the estimation of background noise.

2. The arc fault detection module according to claim 1, wherein the at least one current detecting section is a high frequency current section, wherein the at least one output is a plurality of outputs, wherein the at least one signal based on a current measured from the DC supply line is a plurality of current signals each based on a current measured from the DC supply line, wherein the at least one corresponding predetermined threshold level is a plurality of corresponding predetermined threshold levels, and wherein each output is associated with a respective one of a plurality of frequency sub-bands of a predetermined frequency band, the high-frequency current section being structured to, for each of the frequency sub-bands, (i) detect a rise in energy of the frequency sub-band above a respective one of the corresponding predetermined threshold levels associated with the frequency sub-band for at least a certain amount of time associated with the frequency sub-band based on a respective one of the current signals associated with the frequency sub-band, and (ii) cause the output associated with the frequency sub-band to indicate a rise in energy detection in response to detecting the rise in energy of the frequency sub-band above the associated corresponding predetermined threshold level for at least the associated certain amount of time, and wherein the at least one signal indicative of a current on the DC supply line is a plurality of signals indicative of a current on the DC supply line each being associated with a respective one of the frequency sub-bands, and wherein the processing device is structured to: (i) determine an estimation of background noise based on the signals indicative of a current on the DC supply line, and (ii) for each of the frequency sub-bands, adjust the corresponding predetermined threshold level associated with the frequency sub-band based on the estimation of background noise.

3. The arc fault detection module according to claim 2, wherein the plurality of frequency sub-bands include a first sub-band, a second sub-band, and a third sub-band.

4. The arc fault detection module according to claim 3, wherein the first sub-band is 10-30 kHz, the second sub-band is 140-160 kHz, and the third sub-band is 290-310 kHz.

5. The arc fault detection module according to claim 1, wherein the at least one signal indicative of a current on the DC supply line includes a low frequency current signal and a high-frequency current signal.

6. The arc fault detection module according to claim 1, wherein the processing device is structured to determine the estimation of background noise based on the at least one signal indicative of a current on the DC supply line by performing a statistical analysis of data provided by the at least one signal indicative of a current on the DC supply line.

7. The arc fault detection module according to claim 6, wherein the performing a statistical analysis includes calculating a moving average using the data provided by the at least one signal indicative of a current on the DC supply line.

8. A method of detecting arc faults in a DC electrical system having a DC supply line, comprising:
   determining whether at least one signal based on a current measured from the DC supply line exceeds at least one corresponding predetermined threshold level;
   controlling at least one output signal based on whether the at least one signal based on the current measured from the DC supply line exceeds the at least one corresponding predetermined threshold level;

determining whether an arc fault in the DC electrical system has occurred based on at least the at least one output signal;

determining an estimation of background noise based on at least one signal indicative of a current on the DC supply line using an algorithm in a processing device; and adjusting the at least one corresponding predetermined threshold level based on the estimation of background noise.

9. The method according to claim 8, wherein the at least one output is a plurality of outputs, wherein each output is associated with a respective one of a plurality of frequency sub-bands of a predetermined frequency band, wherein the at least one signal based on a current measured from the DC supply line is a plurality of current signals each based on a current measured from the DC supply line, wherein the at least one corresponding predetermined threshold level is a plurality of corresponding predetermined threshold levels, and wherein the at least one signal indicative of a current on the DC supply line is a plurality of signals indicative of a current on the DC supply line, wherein the estimation of background noise is based on the signals indicative of a current on the DC supply line, and wherein the adjusting comprises adjusting the corresponding predetermined threshold level associated with each frequency sub-band based on the estimation of background noise.

10. The method according to claim 9, wherein the plurality of frequency sub-bands include a first sub-band, a second sub-band, and a third sub-band.

11. The method according to claim 10, wherein the first sub-band is 10-30 kHz, the second sub-band is 140-160 kHz, and the third sub-band is 290-310 kHz.

12. The method according to claim 8, wherein the at least one signal indicative of a current on the DC supply line includes a low frequency current signal and a high-frequency current signal.

13. The method according to claim 8, wherein the estimation of background noise based on the at least one signal indicative of a current on the DC supply line is determined by performing a statistical analysis of data provided by the at least one signal indicative of a current on the DC supply line.

14. The method according to claim 13, wherein the performing a statistical analysis includes calculating a moving average using the data provided by the at least one signal indicative of a current on the DC supply line.

* * * * *